US009696624B2

(12) United States Patent
Thackeray et al.

(10) Patent No.: US 9,696,624 B2
(45) Date of Patent: Jul. 4, 2017

(54) NANOPARTICLE-POLYMER RESISTS

(71) Applicants: The University of Queensland, St. Lucia (AU); Rohm and Haas Electronic Materials LLC, Marlborough, MA (US)

(72) Inventors: James W. Thackeray, Braintree, MA (US); Meiliana Siauw, Annerley (AU); Peter Trefonas, III, Medway, MA (US); Idriss Blakey, Clayfield (AU); Andrew Keith Whittaker, Toowong (AU)

(73) Assignees: ROHM AND HAAS ELECTRONIC MATERIALS LLC, Marlborough, MA (US); THE UNIVERSITY OF QUEENSLAND, St. Lucia (AU)

( * ) Notice: Subject to any disclaimer, the term of this patent is extended or adjusted under 35 U.S.C. 154(b) by 0 days.

(21) Appl. No.: 14/812,238

(22) Filed: Jul. 29, 2015

(65) Prior Publication Data
US 2017/0031244 A1 Feb. 2, 2017

(51) Int. Cl.
*G03F 7/038* (2006.01)
*G06F 7/20* (2006.01)
(Continued)

(52) U.S. Cl.
CPC ............... *G03F 7/09* (2013.01); *G03F 7/038* (2013.01); *G03F 7/0382* (2013.01);
(Continued)

(58) Field of Classification Search
None
See application file for complete search history.

(56) References Cited

U.S. PATENT DOCUMENTS 6,063,543 A * 5/2000 Hien ............... G03F 7/0758
430/270.1
6,534,235 B1 * 3/2003 Hanabata ............ G03F 7/0042
430/191
(Continued)

FOREIGN PATENT DOCUMENTS

JP 05-163021 * 6/1993
WO 2014011603 A1 1/2014
WO 2014051018 A1 4/2014

OTHER PUBLICATIONS

Gonsalves et al., "High refractive-index resists composed of anionic photoacid generator (PAG) bound polymers for 193nm immersions lithography", Proc. SPIE vol. 6923 , 69231P (7 pages) (2008).*
(Continued)

*Primary Examiner* — Martin Angebranndt
(74) *Attorney, Agent, or Firm* — Cantor Colburn LLP

(57) ABSTRACT

A composite, which is a blend comprising: a nanoparticle comprising a core and a coating surrounding the core; and a polymer, wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and wherein the polymer is a polymerization product of a photoacid generator comprising a polymerizable group; at least one unsaturated monomer, which is different from the photoacid generator comprising a polymerizable group; and a chain transfer agent of formula (I);

(Continued)

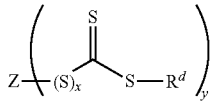

wherein: Z is a y valent $C_{1-20}$ organic group, x is 0 or 1, and $R^d$ is a substituted or unsubstituted $C_{1-20}$ alkyl, $C_{3-20}$ cycloalkyl, $C_{6-20}$ aryl, or $C_{7-20}$ aralkyl.

14 Claims, 15 Drawing Sheets

(51) Int. Cl.
| | |
|---|---|
| G06F 7/32 | (2006.01) |
| G03F 7/09 | (2006.01) |
| G03F 7/20 | (2006.01) |
| G03F 7/32 | (2006.01) |
| G03F 7/039 | (2006.01) |

(52) U.S. Cl.
CPC .......... *G03F 7/0392* (2013.01); *G03F 7/0397* (2013.01); *G03F 7/094* (2013.01); *G03F 7/20* (2013.01); *G03F 7/325* (2013.01)

(56) References Cited

U.S. PATENT DOCUMENTS

| | | | | |
|---|---|---|---|---|
| 8,124,230 | B2 | 2/2012 | Zimmerman et al. | |
| 8,791,293 | B2 * | 7/2014 | Mori | C07C 309/10 |
| | | | | 430/921 |
| 2004/0171777 | A1 * | 9/2004 | Le | C07C 327/36 |
| | | | | 526/286 |
| 2005/0059787 | A1 * | 3/2005 | Benoit | C08F 2/38 |
| | | | | 526/222 |
| 2006/0035167 | A1 * | 2/2006 | Angelopoulos | C08F 220/14 |
| | | | | 430/270.1 |
| 2006/0088787 | A1 * | 4/2006 | Gonsalves | C08G 77/442 |
| | | | | 430/281.1 |
| 2006/0257781 | A1 * | 11/2006 | Benoit | C08F 20/18 |
| | | | | 430/270.1 |
| 2008/0152933 | A1 * | 6/2008 | Mizuno | C08K 9/04 |
| | | | | 428/480 |
| 2008/0187860 | A1 * | 8/2008 | Tsubaki | G03F 7/2024 |
| | | | | 430/270.1 |
| 2009/0118150 | A1 * | 5/2009 | Baum | C08F 2/38 |
| | | | | 508/264 |
| 2009/0233223 | A1 * | 9/2009 | Tachibana | G03F 7/0045 |
| | | | | 430/270.1 |
| 2011/0039105 | A1 * | 2/2011 | Zimmerman | B82Y 30/00 |
| | | | | 428/403 |
| 2012/0135146 | A1 * | 5/2012 | Cheng | H01L 21/0337 |
| | | | | 427/271 |
| 2012/0328983 | A1 * | 12/2012 | Kramer | C08F 220/28 |
| | | | | 430/270.1 |
| 2014/0065550 | A1 * | 3/2014 | Kramer | G03F 7/0041 |
| | | | | 430/296 |
| 2014/0193757 | A1 | 7/2014 | Ogihara et al. | |
| 2015/0234272 | A1 * | 8/2015 | Sarma | G03F 7/0045 |
| | | | | 430/281.1 |

OTHER PUBLICATIONS

Kwon et al., "Synthesis of triphenylsulfonium triflate bound copolymer for electron beams lithography", J. Nanosci. Nanotech. 14(8) 6270-6273 (Aug. 2014).*

Chakrabarty et al.; "Increasing Sensitivity of Oxide Nanoparticle Photoresits"; Extreme Ultraviolet Lithography V; vol. 9048, 90481C; 5 pages; 2014; http://proceedings.spiedigitallibrary.org/ on Apr. 13, 2015.

Chakrabarty et al.; "Oxide nanoparticle EUV resists: toward understanding the mechanism of positive and negative tone patterning"; Extreme Ultraviolet Lithography IV; V. 8679, 867906; 8 pages; 2013; http://proceeding.spiedigitallibrary.org/ on Apr. 13, 2015.

Hagiwara et al.; "Surface Segregation Analysis of Hydrophobic Additive of Non-topcoat Resist"; Journal of Photopolymer Science and Technology; vol. 21, No. 5; pp. 647-654; 2008.

Jiang et al.; "Metal Oxide Nanoparticle Photoresists for EUV Patterning"; Journal of Photopolymer Science and Technology; vol. 27, No. 5; pp. 663-666; 2014.

Kim et al.; "CD uniformity improvement for EUV resists process: EUV resolution enhancement layer"; Extreme Ultraviolet (EUV) Lithography II; vol. 7969, 796916; 10 pages; 2011; http://proceedings.spiedigitallibrary.org/ on Apr. 13, 2015.

Kryask et al.; "Nanoparticle Photoresists: Ligand Exchange as a New and Sensitive EUV Patterning Mechanism"; Journal of Photopolymer Science and Technology; vol. 26, No. 5; pp. 659-664; 2013.

Krysak et al.; "Develpment of an Inorganic Nanoparticle Photoresist for EUV, E-beam and 193 nm Lithography"; Advances in Resist Materials and Processing Tech XXVIII; vol. 7972, 7921C; 6 pages; 2011; http://proceedings.spiedigitallibrary.org/ on Apr. 13, 2015.

Otake et al.; "Hydrophobic Surface Construction by Phase-Separation of Fluorinated block Copolymer for Immersin Lithography"; Journal of Photopolymer Science and Technology; vol. 21, No. 5; pp. 679-684; 2008.

Ouyang et al.; "Non-aqueous negative-tone development of inorganic metal oxide nanoparticle photoresists for next generation lithography"; Adv in Res Mat & Proc Tech XXX; V. 8682,86820R; 6 pp; 2013; http://proceedings.spiedigitallibrayr.org/ on Apr. 13, 2015.

Stowers et al.; "Directly patterned inorganic hardmask for EUV lithography"; Extreme Ultraviolet (EUV) Lithography II; vol. 7969, 796915; 11 pages; 2011; http://proceedings.spiedigitallibrary.org/ on Apr. 13, 2015.

Trikeriotis et al.; "A new inorganic EUV resist with high-etch resistance"; Extreme Ultraviolet (EUV) Lithography III; vol. 8322, 83220U; 6 pages; 2012; http://proceedings.spiedigitallibrary.org/ on Apr. 13, 2015.

Trikeriotis et al.; "Development of an inorganic photoresist for DUV, EUV, and electron beam imaging"; Adv. in Resist Materials and Proc. Tech. XXVII; vol. 7639, 76390E; 10 pages 2010; http://proceedings.spiedigitallibrary.org/ on Apr. 13, 2015.

Trikeriotis et al.; "High-refractive index nanoparticle fluids for 192-nm immersion lithography"; Adv. in Resist Materials and Proc. Tech.XXVI; vol. 7273, 72732A; 6 pages, 2009; http://proceedings.spiedigitallibrary.org/ on Apr. 13, 2015.

* cited by examiner

NANOPARTICLE-POLYMER RESISTS

FIELD

The present disclosure generally relates to the field of semiconductors and semiconductor processing. Particularly, the present disclosure provides a composite including a nanoparticle-polymer resist.

INTRODUCTION

Metal oxide nanoparticles have recently been developed for use in photoresists. Some of the metal oxides (such as $HfO_2$ or $ZrO_2$) surrounded by organic ligands (such as methacrylic acid) can be patterned at EUV wavelengths. During this process, ligands are added to the metal oxides to form nanoparticle aggregates, which are combined with photoacid generators to form photoresists. These photoresists, coated from solvents (such as PGMEA), can be developed either as positive (aqueous base) or negative (2-heptanone) tone.

However, there remains a need in a new photolithography material which would have higher sensitivity and higher resolution than the existing photoresists.

SUMMARY

An embodiment provides a composite, which is a blend comprising:
a nanoparticle comprising a core and a coating surrounding the core; and
a polymer,
wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and
wherein the polymer is a polymerization product of
a photoacid generator comprising a polymerizable group;
at least one unsaturated monomer, which is different from the photoacid generator comprising a polymerizable group; and
a chain transfer agent of formula (I);

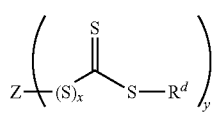
(I)

wherein:
Z is a y valent $C_{1-20}$ organic group,
x is 0 or 1, and
$R^d$ is a substituted or unsubstituted $C_{1-20}$ alkyl, $C_{3-20}$ cycloalkyl, $C_{6-20}$ aryl, or $C_{7-20}$ aralkyl.

Another embodiment provides a method of making a composite, comprising mixing
a nanoparticle comprising a core and a coating surrounding the core; and
a polymer,
wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and
wherein the polymer is a polymerization product of
a photoacid generator comprising a polymerizable group;
at least one unsaturated monomer, which is different from the photoacid generator comprising a polymerizable group; and
a chain transfer agent of formula (I);

(I)

wherein:
Z is a y valent $C_{1-20}$ organic group,
x is 0 or 1,
$R^d$ is a substituted or unsubstituted $C_{1-20}$ alkyl, $C_{3-20}$ cycloalkyl, $C_{6-20}$ aryl, or $C_{7-20}$ aralkyl.

BRIEF DESCRIPTION OF THE DRAWINGS

The above and other aspects, advantages, and features of this disclosure will become more apparent by describing in further detail exemplary embodiments thereof with reference to the accompanying drawings, in which.

DETAILED DESCRIPTION

Figure 1:
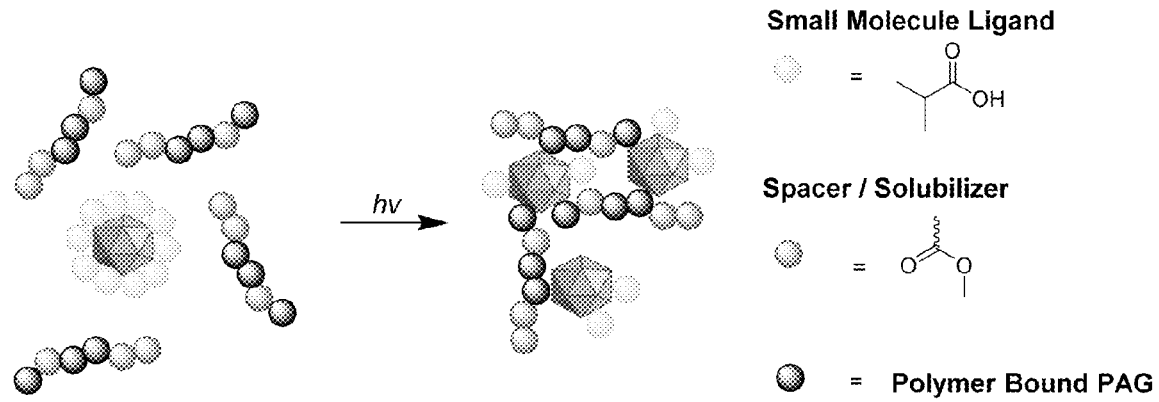
FIG. 1 is a schematic representation of a process of making a nanoparticle-polymer composite according to an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, the term "alkyl group" refers to a group derived from a straight or branched chain saturated aliphatic hydrocarbon having the specified number of carbon atoms and having a valence of at least one.

As used herein, when a definition is not otherwise provided, the term "fluoroalkyl group" refers to an alkyl group in which one or more hydrogen atoms are replaced with fluorine atoms.

As used herein, when a definition is not otherwise provided, the term "alkoxy group" refers to "alkyl-O—", wherein the term "alkyl" has the same meaning as described above.

As used herein, when a definition is not otherwise provided, the term "fluoroalkoxy group" refers to an alkoxy group in which one or more hydrogen atoms are replaced with fluorine atoms.

As used herein, when a definition is not otherwise provided, the term "cycloalkyl group" refers to a monovalent group having one or more saturated rings in which all ring members are carbon.

As used herein, when a definition is not otherwise provided, the term "heterocyclic group" refers to a monovalent saturated or unsaturated cyclic group that has atoms of at least two different elements as members of its ring(s).

As used herein, when a definition is not otherwise provided, the term "aryl", which is used alone or in combination, refers to an aromatic hydrocarbon containing at least one ring and having the specified number of carbon atoms. The term "aryl" may be construed as including a group with an aromatic ring fused to at least one cycloalkyl ring.

As used herein, when a definition is not otherwise provided, the term "aryloxy group" refers to "aryl-O—", wherein the term "aryl" has the same meaning as described above.

As used herein, when a definition is not otherwise provided, the term "aralkyl group" refers to a substituted or unsubstituted aryl group covalently linked to an alkyl group that is linked to a compound.

As used herein, when a definition is not otherwise provided, the term "alkylene group" refers to a straight or branched saturated aliphatic hydrocarbon group having a valence of at least two, optionally substituted with one or more substituents where indicated, provided that the valence of the alkylene group is not exceeded.

As used herein, when a definition is not otherwise provided, the term "cycloalkylene group" refers to a cyclic hydrocarbon group having a valence of at least two, optionally substituted with one or more substituents where indicated, provided that the valence of the cycloalkylene group is not exceeded.

As used herein, when a definition is not otherwise provided, the term "arylene group" refers to a functional group having a valence of at least two obtained by removal of two hydrogens in an aromatic ring, optionally substituted with one or more substituents where indicated, provided that the valence of the alkylene group is not exceeded.

As used herein, when a definition is not otherwise provided, the term "aralkylene group" refers to a functional group having a valence of at least two obtained by removal of two hydrogens from the alkyl-substituted aromatic compound, optionally substituted with one or more substituents where indicated, provided that the valence of the aralkylene group is not exceeded.

As used herein, when the definition is not otherwise provided, the terms "blend" and "mixture" refer to any combination of the ingredients constituting the blend or mixture without regard to a physical form.

This invention relates to the development of inorganic-polymer hybrid materials for use in the semiconductor industry. The inorganic metal oxide nanoparticles (such as $ZrO_2$, $HfO_2$ and $TiO_2$) are small ($\leq 10$ nm), they offer high etch resistance, and therefore, can improve pattern transfer, especially for small pattern size ($\leq 25$ nm) and thin films. The polymer used in the inorganic-polymer hybrid material contains PAG (photoactive generator compound) along the polymer backbone (polymer bound PAG).

Metal oxide nanoparticles combined with polymer bound PAG (e.g., bound by blending or grafting) could cause multiple crosslinking among the nanoparticles upon irradiation, which may lead to the production of high sensitivity and high resolution photolithography material (which provides less dose and high pattern quality) (FIG. 1).

Disclosed herein is a composite, which is a blend comprising:
a nanoparticle comprising a core and a coating surrounding the core; and
a polymer,
wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and
wherein the polymer is a polymerization product of
a photoacid generator comprising a polymerizable group;
at least one unsaturated monomer, which is different from the photoacid generator comprising a polymerizable group; and
a chain transfer agent of formula (I);

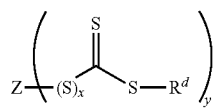

wherein:
Z is a y valent $C_{1-20}$ organic group,
x is 0 or 1, and
$R^d$ is a substituted or unsubstituted $C_{1-20}$ alkyl, $C_{3-20}$ cycloalkyl, $C_{6-20}$ aryl, or $C_{7-20}$ aralkyl.

The core of the nanoparticle may include an oxide of any metal element and may include an oxide of lithium, beryllium, sodium, magnesium, aluminum, silicon, calcium, potassium, manganese, scandium, titanium, vanadium, chromium, zinc, iron, cobalt, nickel, copper, gallium, germanium, arsenic, selenium, zirconium, rubidium, strontium, yttrium, niobium, molybdenum, technetium, ruthenium, tin, cadmium, indium, cesium, antimony, tellurium, neodymium, barium, lanthanum, cerium, praseodymium, terbium, promethium, samarium, europium, gadolinium, ytterbium, dysprosium, holmium, erbium, thulium, rhenium, lutetium, hafnium, tantalum, tungsten, thallium, lead, and bismuth. These oxides may be binary, ternary, or higher order compounds. Further, a pure material (for example, zirconium dioxide) or mixed materials (for example, titanium dioxide and aluminum oxide) can be used including any mixture of oxides from the elements listed above. The core of the nanoparticle may include a Group IV element oxide, for example, zirconium oxide ($ZrO_2$), hafnium oxide ($HfO_2$), and titanium oxide ($TiO_2$). A skilled artisan will readily recognize that the reactions used to functionalize and cap the nanoparticles provided herein may need to be modified slightly for each metal oxide in order to provide optimum size, quality, and yield.

The nanoparticle may include a core and a coating surrounding the core. The coating effectively caps the core of the nanoparticle. For example, the core of the nanoparticle may include zirconium oxide ($ZrO_2$), hafnium oxide ($HfO_2$), and titanium oxide ($TiO_2$), and the coating may include a ligand, which is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof, but is not limited thereto.

The capping of the metal oxide nanoparticles may be carried out in various manners. One method includes using a $C_1$-$C_{16}$ carboxylic acid which caps the nanoparticle with either the carboxylic acid or a salt thereof. The capping carboxylic acid may be any carboxylic acid, for example, acetic acid, propionic acid, n-butyric acid, isobutyric acid, but is not limited thereto.

Another method includes using a $C_1$-$C_{16}$ amino acid which caps the nanoparticle with either the amino acid or a salt thereof. The capping amino acid may be any amino acid or a salt thereof. For example, the capping amino acid can be an aliphatic amino acid or a salt thereof, such as glycine, alanine, valine, leucine, or isoleucine; a cyclic amino acid or a salt thereof, such as proline; an aromatic amino acid or a salt thereof, such as phenylalanine, tyrosine, or tryptophan; a basic amino acid or a salt thereof, such as histidine, lysine, or arginine; or an acidic amino acid or a salt thereof, such as aspartate, glutamate, asparagine, or glutamine. But the amino acids are not limited thereto, and any amino acid suitable for capping a nanoparticle can be used.

Still another method includes a $C_1$-$C_{16}$ phosphoric acid which caps the nanoparticle and/or some derivative of the phosphoric acid. A derivative of the phosphoric acid may be a salt of the phosphoric acid or a phosphonate. In an embodiment, a phosphonate may be a substituted or unsubstituted $C_1$-$C_{16}$ dialkyl phosphonate, but is not limited thereto. Some dialkyl phosphonates suitable for capping are shown below:

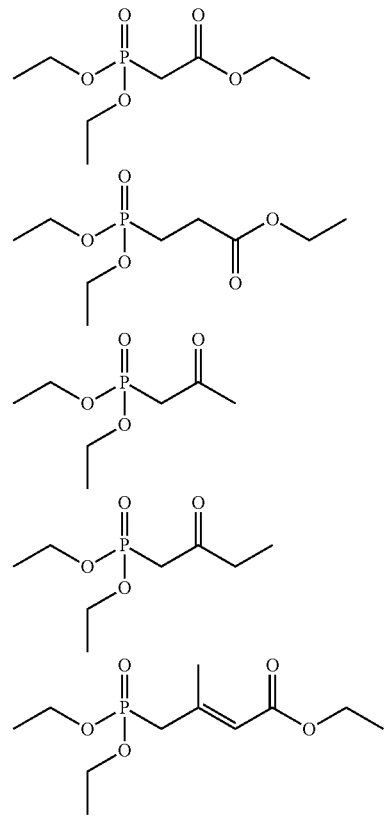

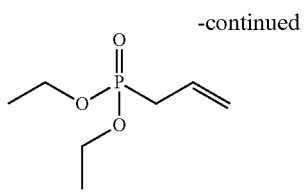

In an embodiment, the nanoparticle may be $ZrO_2$ coated with isobutyric acid or a salt thereof. The isobutyrate-capped $ZrO_2$ may be synthesized from zirconium isopropoxide and isobutyric acid in water as described in the example below. In some embodiments, the capped metal oxide nanoparticles disclosed herein do not aggregate.

The present method allows obtaining high quality nanoparticle slurry in which the nanoparticles maintain their size and do not aggregate or grow significantly under adverse conditions, for example, when a nanoparticle containing solution is heated to elevated temperatures. In this regard, it is desired to use nanoparticles which are similar in size. The present disclosure provides for nanoparticles with the median diameter of 10 nm or less, for example, 6 nm or less, 3 nm or less, or even 1 nm or less. Accurate size control can be achieved by drying an aqueous suspension of the nanoparticles at varying temperatures and then re-suspending the dried powder in water or solvent.

Some metals constituting the nanoparticles are toxic and may represent danger to human health. Therefore, to reduce or prevent harmful method contamination, effective methods of purification of the nanoparticles are highly desired. In the present method, the purification of nanoparticles can be achieved by a variety of techniques such as solvent exchange, centrifugation, or multiple decantation. Other purification methods may include, but are not limited to dialysis, dielectrophoretic electrode arrays, size exclusion chromatography, diafiltration, field flow fractionation, and ultra-filtration. Purification by ultra-filtration is achieved by passing a solution through a filter having very small pores that do not allow for the passage of the particles. The non-limiting examples of the filters that can be used are polytetrafluorethylene (PTFE) membrane filter, but not limited to nylon, polycarbonate, polyester, polyethersulfone, or cellulose type membrane filter.

The composition further comprises a photoacid generator. The photoacid generator in the composition may be represented by formula (II):

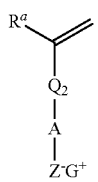

(II)

In the formula (II), each $R^a$ may independently be H, F, $C_{1-10}$ alkyl, or $C_{1-10}$ fluoroalkyl. As used throughout this specification, "fluoro" or "fluorinated" means that one or more fluorine groups are attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms; similarly, "fluoroaryl" means monofluoroaryl, perfluoroaryl, etc. "Substantially all" in this context means greater than or equal to 90%, preferably greater than or equal to 95%, and still more preferably greater than or equal to 98% of all atoms attached to carbon are fluorine atoms.

In the formula (II), $Q_2$ is a single bond or an ester-containing or non-ester containing, fluorinated or non-fluorinated group selected from $C_{1-20}$ alkyl, $C_{3-20}$ cycloalkyl, $C_{6-20}$ aryl, and $C_{7-20}$ aralkyl. For example, where an ester is included, the ester forms a connective link between $Q_2$ and the point of attachment to the double bond. In this way, where $Q_2$ is an ester group, formula (II) may be a (meth) acrylate monomer. Where an ester is not included, $Q_2$ may be aromatic, so that formula (II) may be, for example, a styrenic monomer or vinyl naphthoic monomer.

Also, in formula (II), A is an ester-containing or non ester-containing, fluorinated or non-fluorinated group selected from $C_{1-20}$ alkyl, $C_{3-20}$ cycloalkyl, $C_{6-20}$ aryl, or $C_{7-20}$ aralkyl. Useful A groups may include fluorinated aromatic moieties, straight chain fluoroalkyl, or branched fluoroalkyl esters. For example, A may be a $[(C(R^e)_2)_x(=O)O]_c—(C(R^f)_2)_y(CF_2)_z—$ group, or an o-, m- or p-substituted $—C_6R^g{}_4—$ group, where each $R^e$, $R^f$, and $R^g$ are each independently H, F, $C_{1-6}$ fluoroalkyl, or $C_{1-6}$ alkyl, c is 0 or 1, x is an integer of 1 to 10, y and z are independently integers of from 0 to 10, and the sum of y+z is at least 1.

Also, in formula (II), $Z^-$ is an anionic group including a sulfonate ($—SO_3{}^-$), the anion of a sulfonamide ($—SO_2(N^-)$R' where R' is a $C_{1-10}$ alkyl or $C_{6-20}$ aryl), or the anion of a sulfonimide. Where Z is a sulfonimide, the sulfonimide may be an asymmetric sulfonimide having the general structure $A-SO_2—(N^-)—SO_2—Y^2$, where A is as described above, and $Y^2$ is a straight chain or branched $C_{1-10}$ fluoroalkyl group. For example, the $Y^2$ group may be a $C_{1-4}$ perfluoroalkyl group, which may be derived from the corresponding perfluorinated alkanesulfonic acid, such as trifluoromethanesulfonic acid or perfluorobutanesulfonic acid.

In an embodiment, the monomer of formula (II) may have the structure of formula (IIa) or (IIb):

wherein, A and $R^a$ are as defined for formula (II).

Formula (II) further includes a cation $G^+$, which may be a metal or non-metal cation. For example, a non-metal cation may include an onium cation, such as a sulfonium cation, an oxonium cation, or an iodonium cation. For example, the cation $G^+$ may be an onium cation having formula (III):

(III)

wherein,

X is S or I, each $R^c$ is halogenated or non-halogenated and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and z is 2 or 3, and wherein when X is I, z is 2, or when X is S, z is 3.

For example, cation $G^+$ may have formula (VII), (VIII), or (IX):

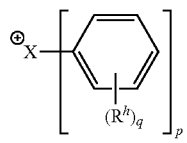
(VII)

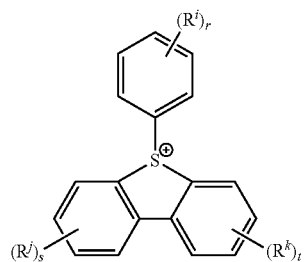
(VIII)

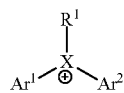
(IX)

wherein,

X is I or S, $R^h$, $R^i$, $R^j$, and $R^k$ are each independently hydroxy, nitrile, halogen, $C_{1-10}$ alkyl, $C_{1-10}$ fluoroalkyl, $C_{1-10}$ alkoxy, $C_{1-10}$ fluoroalkoxy, $C_{6-20}$ aryl, $C_{6-20}$ fluoroaryl, $C_{6-20}$ aryloxy, or $C_{6-20}$ fluoroaryloxy, $Ar^1$ and $Ar^2$ are independently $C_{10-30}$ fused or singly bonded polycyclic aryl groups;

$R^l$ is a lone pair of electrons where X is I, or a $C_{6-20}$ aryl group where X is S;

p is an integer of 2 or 3, wherein when X is I, p is 2, and where X is S, p is 3, q and r are each independently an integer from 0 to 5, and s and t are each independently an integer from 0 to 4.

Exemplary photoacid-generating monomers of the formula (II) include:

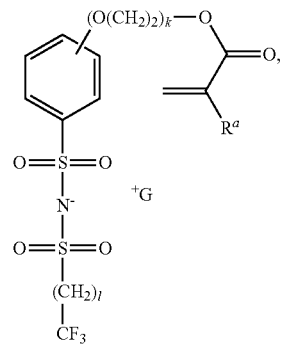

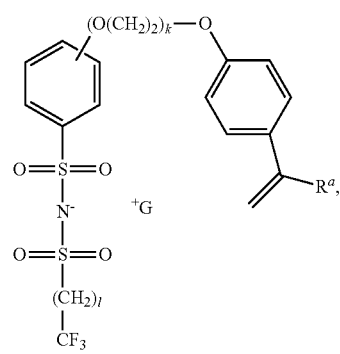

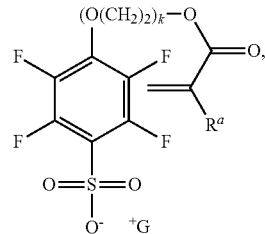

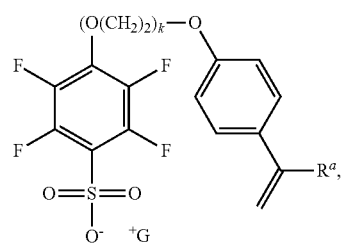

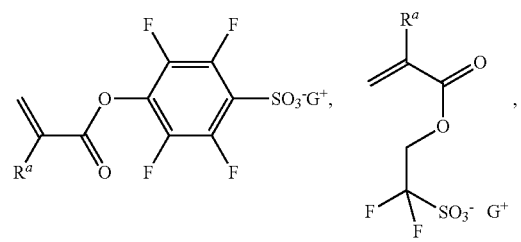

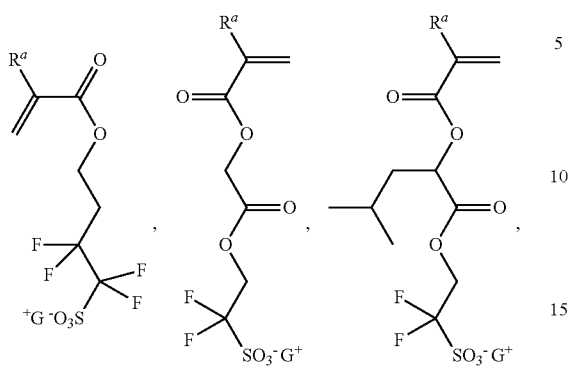
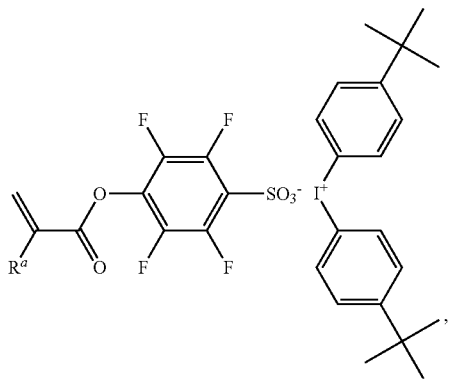
or a combination comprising at least one of the foregoing, where
each $R^a$ is independently H, F, $C_{1-6}$ alkyl, or $C_{1-6}$ fluoroalkyl,
k is an integer of 0 to 4,
l is an integer of 0 to 3, and
$G^+$ is a cation of formula (V).
For example, $G^+$ may be a cation of formulas (VII), (VIII), or (IX).
Specific exemplary photoacid-generating monomers of the formula (II) include those having the formula:
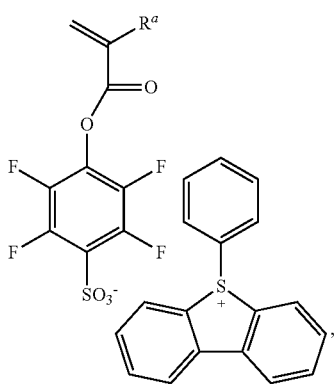
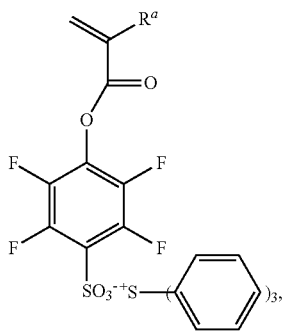
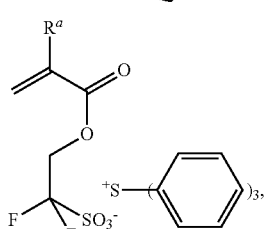
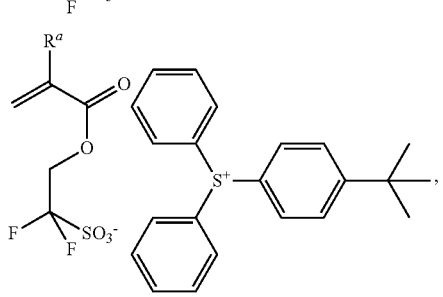
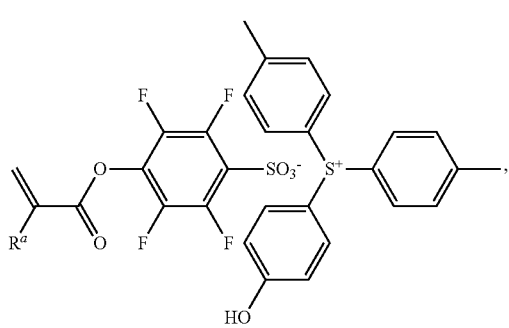
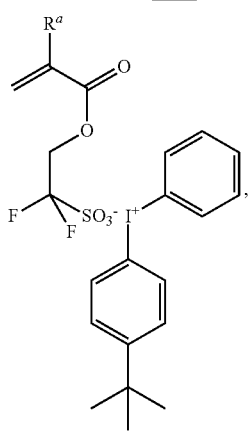

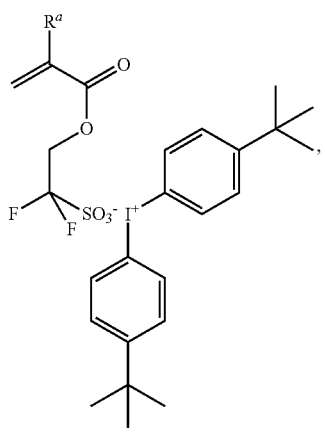
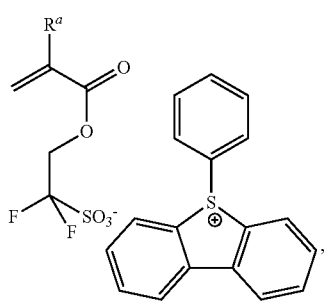
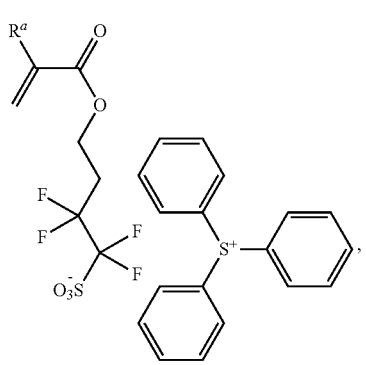
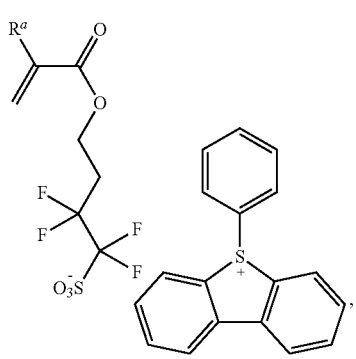
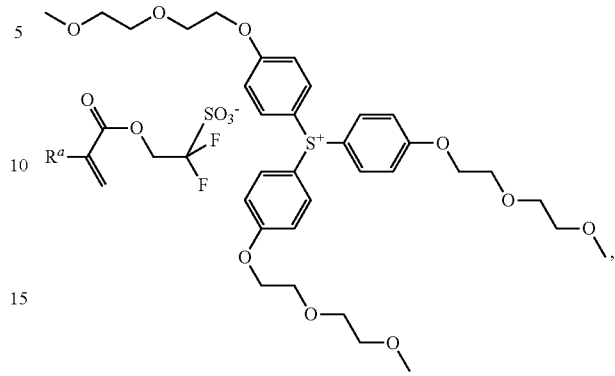
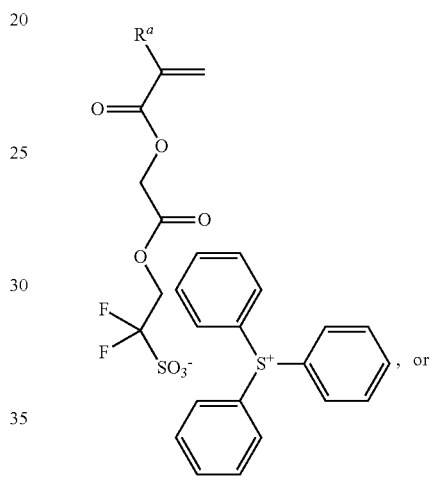
, or
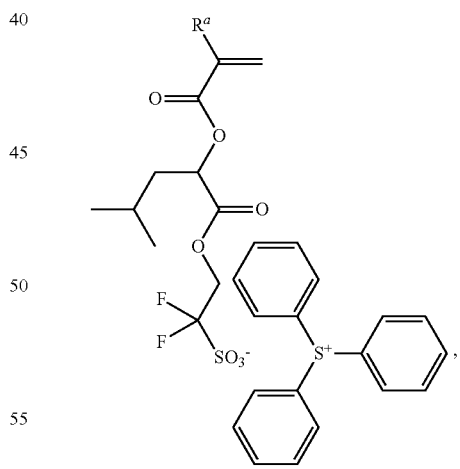
,
wherein $R^a$ is H, F, $C_{1-6}$ alkyl, or $C_{1-6}$ fluoroalkyl.
The composition further includes at least one unsaturated monomer, which is different from the photoacid generator including a polymerizable group. For example, the unsaturated monomer may be an acid-deprotectable monomer of formula (IV):

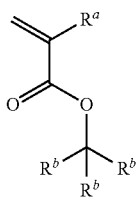

In the formula (IV), $R^b$ is independently H, $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In an embodiment, the tertiary group including $R^b$ in formula (IV) may be a t-butyl group. In another embodiment, the formula (IV) may include cycloalkyl structures, which incorporate two or more $R^b$ groups, such as 1-methylcyclopentyl, 1-ethylcyclopentyl, and 1-methylcyclohexyl, and the like.

Exemplary acid deprotectable monomers of the formula (IV) may include:

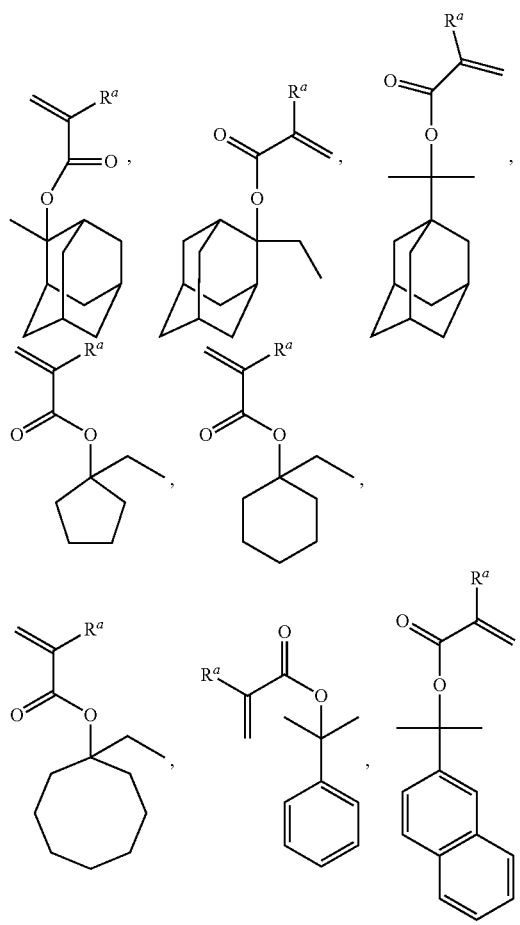

or a combination comprising at least one of the foregoing, wherein $R^a$ is H, F, $C_{1-6}$ alkyl, or $C_{1-6}$ fluoroalkyl.

The unsaturated monomer may be a base-soluble monomer of formula (V):

In the formula (V), $Q_1$ is an ester-containing or non-ester containing group selected from $C_{1-20}$ alkyl, $C_{3-20}$ cycloalkyl, $C_{6-20}$ aryl, and $C_{7-20}$ aralkyl group. In an embodiment, where an ester is included, the ester forms a connective link between $Q_1$ and the point of attachment to the double bond. In this way, where $Q_1$ is an ester group, the formula (V) may be a (meth)acrylate monomer. In another embodiment, where an ester is not included, $Q_1$ may be aromatic, so that the formula (V) may be, for example, a styrenic monomer or vinyl naphthoic monomer. $Q_1$ may be fluorinated or non-fluorinated. Further in the formula (V), a is an integer of 1 to 3, for example, a is 1 or 2.

Also in the formula (V), W is a base-reactive group comprising —C(=O)—OH; —C(CF$_3$)$_2$OH; —NH—SO$_2$—Y$^1$ where Y$^1$ is F or $C_{1-4}$ perfluoroalkyl; an aromatic —OH; or an adduct of any of the foregoing with a vinyl ether. In an embodiment, where Q is non-aromatic (e.g., where formula (II) includes a (meth)acrylate structure having an ester linked alkyl or cycloalkyl group Q), W is —C(CF$_3$)$_2$OH. In another embodiment, where Q is aromatic (e.g., where Q is either ester-linked or non-ester linked and is an aromatic group such as phenyl or naphthyl), W is OH or —C(CF$_3$)$_2$OH. It is contemplated that any of the base-reactive groups may further be protected by an acid decomposable acetal leaving group (e.g., having a generic structure —O—CH(R')—O—R" where R' may be a methyl, ethyl, or other alkyl group). Such groups are adducts of a vinyl ether, such as, for example, ethyl vinyl ether, propyl vinyl ether, t-butyl vinyl ether, cyclohexylvinyl ether, the 2-vinyloxyethyl ester of 1-adamantane carboxylic acid, 2-naphthoyl ethyl vinyl ether, or other such vinyl ethers.

Exemplary base-soluble monomers having the formula (V) may include:

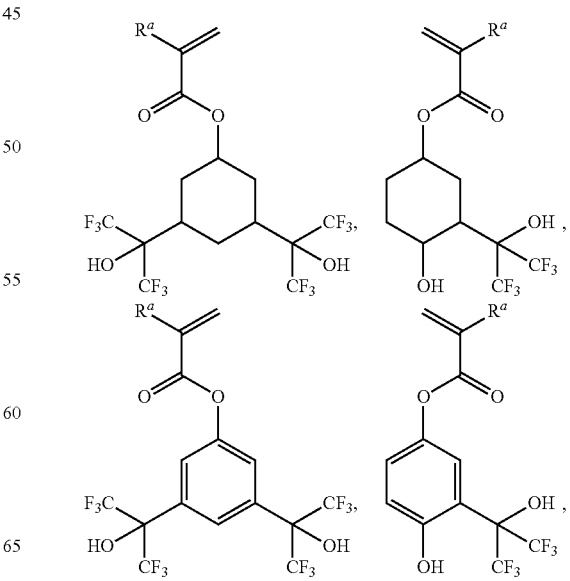

-continued

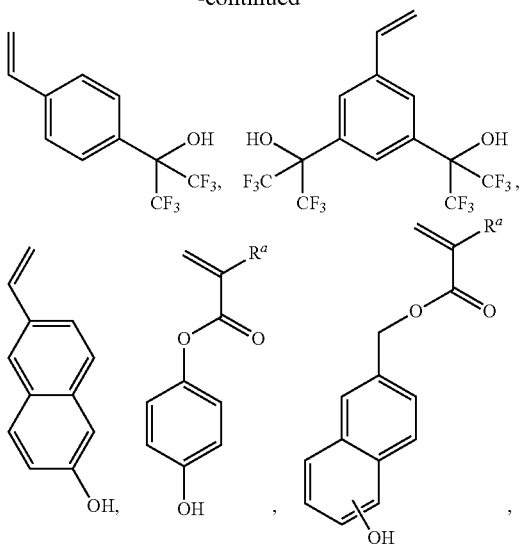

or a combination comprising at least one of the foregoing, wherein $R^a$ is H, F, $C_{1-6}$ alkyl, or $C_{1-6}$ fluoroalkyl.

The unsaturated monomer may be a lactone-containing monomer of formula (VI):

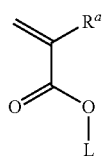
(VI)

In the formula (VI), L is a monocyclic, polycyclic, or fused polycyclic $C_{4-20}$ lactone-containing group. Such lactone groups may be included to improve both adhesion of the polymer to a substrate, and to moderate the dissolution of the polymer in a base developer. In an embodiment, L may be a monocyclic $C_{4-6}$ lactone which is attached to a (meth)acrylate moiety through a monocycle ring carbon; or L may be a $C_{6-10}$ fused polycyclic lactone based on a norbornane-type structure.

In an embodiment, lactone-containing monomers may have the formula (VIa):

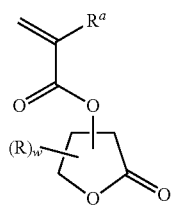
(VIa)

wherein,
$R^a$ is H, F, $C_{1-6}$ alkyl, or $C_{1-6}$ fluoroalkyl, R is a $C_{1-10}$ alkyl, cycloalkyl, or heterocycloalkyl, and
w is an integer of 0 to 6.

It will be appreciated in the formula (VIa) that R may be separate or may be attached to the lactone ring and/or one or more R groups, and that the methacrylate moiety may be attached to the lactone ring directly, or indirectly through R.

Exemplary lactone-containing monomers of the formulas (VI) and (VIa) may include:

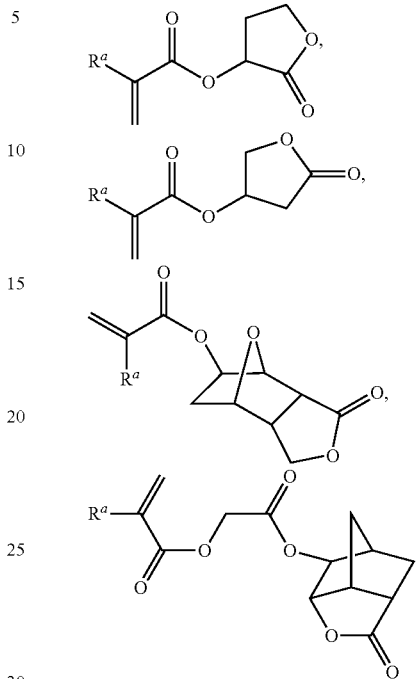

or a combination comprising at least one of the foregoing, wherein $R^a$ is H, F, $C_{1-6}$ alkyl, or $C_{1-6}$ fluoroalkyl.

The unsaturated monomer may be any combination of the acid deprotectable monomer of the formula (IV), a base-soluble monomer of the formula (V), and a lactone-containing monomer of the formula (VI).

The composition further includes a chain transfer agent. The chain transfer agent may be any compound based on the dithioester or trithiocarbonate functional groups and suitable for chain transfer under conditions of reversible addition-fragmentation transfer (RAFT) polymerization. The chain transfer agent comprises a compound of formula (I):

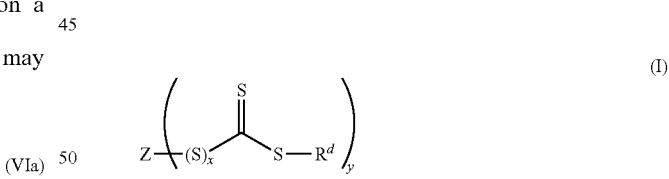
(I)

wherein,
x is 0 or 1, and
Z is a y valent $C_{1-20}$ organic group.

In an embodiment, Z is substituted or unsubstituted, may be a $C_{1-20}$ alkyl, $C_{3-20}$ cycloalkyl, $C_{2-20}$ heterocyclic, $C_{6-20}$ aryl, or $C_{7-20}$ aralkyl, and may contain a halogen, ether, sulfide, carboxylic acid, ester, amide, nitrile, or other functional group. While y may be any integer of 1 or greater depending on the valence of group Z, y is preferably an integer of from 1 to 3, and more preferably 1 or 2.

Also in the formula (I), $R^d$ is a substituted or unsubstituted $C_{1-20}$ alkyl, $C_{3-20}$ cycloalkyl, $C_{6-20}$ aryl, or $C_{7-20}$ aralkyl. For example, $R^d$ may be derived from a radical initiator such as a peroxy or diazo initiator.

Group

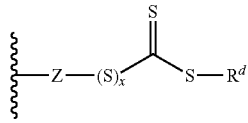

of a chain transfer agent of the formula (I) may be included in the polymerization product as an end group. This group can be removed by a number of methods including a reaction with a radical source, for example, by radical induced reduction.

In an embodiment, the chain transfer agent may include a compound in which Z is a $C_6$ aryl group, such as those of formula (X):

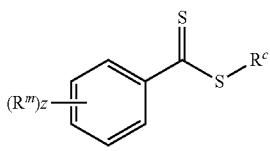

(X)

wherein, $R^m$ is a $C_{1-10}$ alkyl, $C_{1-10}$ alkoxy, $C_{3-10}$ cycloalkyl, $C_{6-10}$ aryl, or $C_{7-10}$ aralkyl group, z is an integer from 0 to 5, and $R^c$ is substituted or unsubstituted and is a $C_{1-10}$ alkyl or $C_{6-10}$ aryl group.

Group

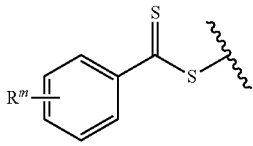

of a chain transfer agent of formula (I) is included in the polymerization product as an end group. This group can be removed by a number of methods including a reaction with a radical source, for example, by radical induced reduction.

Exemplary chain transfer agents of formula (I) include:

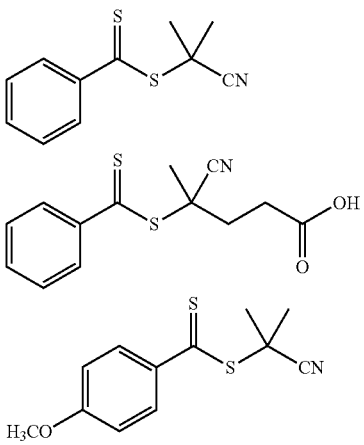

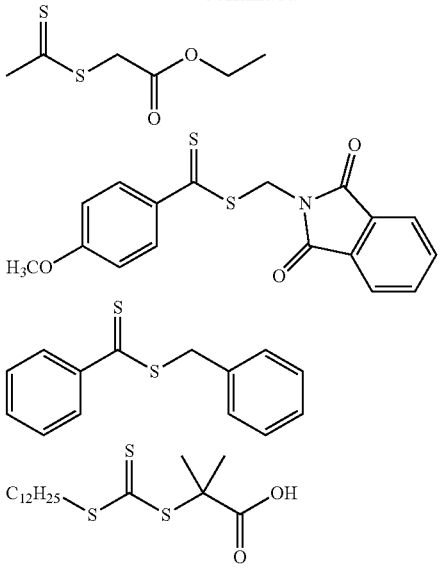

or a combination comprising at least one of the foregoing.

The composition may optionally include an initiator. Suitable initiators may include any radical initiator useful in the art, such as peroxy initiators, diazo initiators, and the like. For example, peroxy initiators such as tert-butyl hydroperoxide, tert-butyl peroxy 2-ethyl hexanoate (tert-butyl peroctoate), t-butyl peroxy pivalate, tert-butyl peroxy benzoate, di-benzoyl peroxide, tert-butyl peroxy isobutyrate, diazo initiators such as azobis isobutyronitrile (AIBN), 4,4'-azobis(4-cyanovaleric acid); and the like. Preferred initiators include those sold under the trade name VAZO by DuPont, such as VAZO 52, VAZO 67, VAZO 88, and VAZO V-601 free-radical initiators. Alternatively, the polymerization may be carried out by thermal initiation (e.g., greater than about 120° C., more preferably greater than about 150° C.). Preferably, thermal initiation may be used where one or more component monomers are styrenic.

The copolymer may thus be prepared by radically or thermally initiated polymerization of the monomers, preferably in a degassed solvent, in the presence of the chain transfer agent, using the aforementioned reversible addition-fragmentation transfer (RAFT) process. The polymerization may be carried out in batch mode, by batch addition of monomers and/or initiator to the reaction mixture containing the chain transfer addition, by metered addition of separate feeds of one or more of the monomers and/or initiator and/or chain transfer agent to the reaction mixture, or any other suitable method for combining the reactants. It will be appreciated that block copolymers may be produced by sequential addition of monomers for each block to the reaction mixture, or a polymer having a graded composition (statistical or gradient) may be formed by gradually changing the monomer proportions and/or composition in the feed over time. All such polymers preparable by the RAFT method are contemplated herein.

Other methods of synthesizing suitable copolymers are also contemplated, and with proper choice and control of initiators, solvent, monomers and polymerization process and isolation conditions could yield polymers of desirable molecular weight and dispersity. Alternative polymerization methods include, but are not limited to: free radical polymerization, atom transfer radical polymerization (ATRP), stable free radical polymerization (SFRP), nitroxide mediated polymerization (NMP), reversible-deactivation radical polymerization, anionic step growth polymerization, cationic step growth polymerization and ring opening metathesis polymerization (ROMP).

The copolymer may have a weight-averaged molecular weight (Mw) of 1,000 to 100,000 g/mol, preferably 1,500 to 50,000 g/mol, more preferably 2,000 to 25,000 g/mol, and still more preferably 3,000 to 15,000 g/mol. The copolymer may also have a number averaged molecular weight (Mn) of 500 to 100,000 g/mol, preferably 1,000 to 50,000 g/mol, more preferably 1,500 to 25,000 g/mol, and still more preferably 2,000 to 15,000 g/mol. Molecular weights may be determined using any suitable method, such as nuclear magnetic resonance (NMR) or gel permeation chromatography (GPC) using a crosslinked styrene-divinylbenzene column calibrated to polystyrene standards by universal calibration, at a flow rate of about 1 ml/min. The polymer polydispersity (Mw/Mn) is preferably less than 2.0, more preferably less than or equal to 1.8, more preferably less than or equal to 1.6, and more preferably less than or equal to 1.5.

A photoresist composition includes the copolymer having the polymer-bound PAG as described above. The photoresist may also include, in addition to the PAG compound and polymer, additives including, for example, a photo-destroyable base, and a surfactant. Other additives, such as dissolution rate inhibitors, sensitizers, additional PAGs, etc., may also be included. The photoresist components are dissolved in solvent for dispensing and coating.

Photo-destroyable bases include photo-decomposable cations, and preferably those also useful for preparing PAGs, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Photo-destroyable bases include cation/anion pairs of the following structures, and the cation is triphenylsulfonium or one of the following:

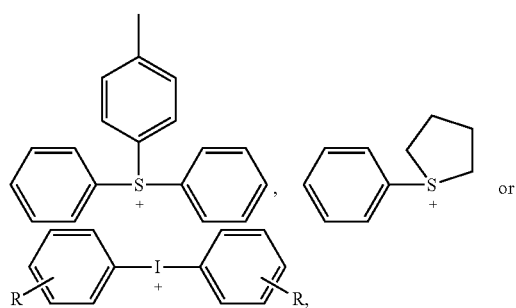

where R is independently H, a $C_{1-20}$ alkyl, a $C_{6-20}$ aryl, or a $C_{6-20}$ alkyl aryl, and the anion is

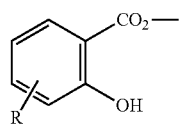

or RC(=O)—O where R is independently H, a $C_{1-20}$ alkyl, a $C_{1-20}$ alkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, other additives may include quenchers that are non-photo-destroyable bases, such as, for example, those based on hydroxides, carboxylates, amines, imines, and amides. For example, such quenchers may include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBM), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

The photoresist composition disclosed herein may include the copolymer in an amount of 0.15 to 55 wt %, specifically 0.2 to 45 wt %, more specifically 0.25 to 40 wt %, and still more specifically 0.3 to 34 wt % based on the total weight of solids. In some embodiments, the photoresist composition may include the copolymer in an amount of less than 1%. It will be understood that "copolymer" used in this context of a component in a photoresist may mean only the copolymer disclosed herein, or a combination of the copolymer with another polymer useful in a photoresist. Additional PAG may be present in the photoresist in an amount of 0.01 to 25 wt %, specifically 0.02 to 15 wt %, and still more specifically 0.05 to 13 wt %, based on the total weight of solids. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of, for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.2 to 50 wt %, specifically 0.5 to 45 wt %, more specifically 1 to 40 wt %, and still more specifically 2 to 35 wt %, based on the total weight of solids and solvent. It will be understood that the solids include nanoparticle, copolymer, photo-destroyable base, quencher, surfactant, any added PAG, and any optional additives, exclusive of solvent.

The photoresist including the copolymer having the anion-bound PAG as disclosed herein may be used to provide a layer comprising the photoresist. A coated substrate may be formed from the photoresist containing the polymer-bound PAG. Such a coated substrate includes: (a) a substrate having one or more layers to be patterned on a surface thereof; and (b) a layer of the photoresist composition including the polymer-bound PAG over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layers on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying (casting) a layer of a photoresist composition including the polymer-bound PAG on a surface of the substrate; (b) pattern-wise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispensing, the wafer may be spun at a speed of up to 4,000 rpm, preferably from about 200 to 3,000 rpm, and more preferably 1,000 to 2,500 rpm. The coated wafer is spun to remove solvent, and baked on a hot plate to remove residual solvent and free volume from the film to make it uniformly dense.

The casting solvent can be any suitable solvent known to one of ordinary skill in the art. For example, the casting solvent can be an aliphatic hydrocarbon (such as hexane, heptane, and the like), an aromatic hydrocarbon (such as toluene, xylene, and the like), a halogenated hydrocarbon (such as dichloromethane, 1,2-dichloroethane, 1-chlorohexane, and the like), an alcohol (such as methanol, ethanol, 1-propanol, iso-propanol, tert-butanol, 2-methyl-2-butanol, 4-methyl-2-pentanol, and the like), water, an ether (such as diethyl ether, tetrahydrofuran, 1,4-dioxane, anisole, and the like), a ketone (such as acetone, methyl ethyl ketone, methyl isobutyl ketone, 2-heptanone, cyclohexanone, and the like), an ester (such as ethyl acetate, n-butyl acetate, propylene glycol monomethyl ether acetate (PGMEA), ethyl lactate, ethyl acetoacetate, and the like), a lactone (such as γ-butyrolactone, ε-caprolactone, and the like), a nitrile (such as acetonitrile, propionitrile, and the like), an aprotic bipolar solvent (such as dimethylsulfoxide, dimethylformamide, and the like), or a combination thereof. The choice of the casting solvent depends on a particular photoresist composition and can be readily made by one of ordinary skill in the art based on his/her knowledge and experience.

Pattern-wise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid or the by-products then effects a chemical change in the polymer and nanoparticles (deblocking the acid sensitive group to generate a base-soluble group, or alternatively, catalyzing a crosslinking reaction in the exposed areas). The resolution of such exposure tools may be less than 30 nm.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is a negative tone, based on a polymer having pendant and/or free acid groups or by-products (derived from bound or free PAG following irradiation) that inhibit the dissolution of the nanoparticles, and the developer is preferably a solvent based. A pattern forms by developing. The solvent developer can be any suitable developer known in the art. For example, the solvent developer can be an aliphatic hydrocarbon (such as hexane, heptane, and the like), an aromatic hydrocarbon (such as toluene, xylene, and the like), a halogenated hydrocarbon (such as dichloromethane, 1,2-dichloroethane, 1-chlorohexane, and the like), an alcohol (such as methanol, ethanol, 1-propanol, iso-propanol, tert-butanol, 2-methyl-2-butanol, 4-methyl-2-pentanol, and the like), water, an ether (such as diethyl ether, tetrahydrofuran, 1,4-dioxane, anisole, and the like), a ketone (such as acetone, methyl ethyl ketone, methyl isobutyl ketone, 2-heptanone, cyclohexanone, and the like), an ester (such as ethyl acetate, n-butyl acetate, propylene glycol monomethyl ether acetate (PGMEA), ethyl lactate, ethyl acetoacetate, and the like), a lactone (such as γ-butyrolactone, ε-caprolactone, and the like), a nitrile (such as acetonitrile, propionitrile, and the like), an aprotic bipolar solvent (such as dimethylsulfoxide, dimethylformamide, and the like), or a combination thereof. In an embodiment, the solvent developer may be a miscible mixture of solvents, for example, a mixture of an alcohol (iso-propanol) and ketone (acetone). The choice of the developer solvent depends on a particular photoresist composition and can be readily made by one of ordinary skill in the art based on his/her knowledge and experience.

The photoresist may, when used in one or more such pattern-forming processes, be used to fabricate electronic and optoelectronic devices such as memory devices, processor chips (CPU's), graphics chips, and other such devices.

Provided further herein is a method of making a composite, comprising mixing
  a nanoparticle comprising a core and a coating surrounding the core; and
  a polymer,
  wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and
  wherein the polymer is a polymerization product of
    a photoacid generator comprising a polymerizable group;

at least one unsaturated monomer, which is different from the photoacid generator comprising a polymerizable group; and a chain transfer agent of formula (I);

wherein:
Z is a y valent $C_{1-20}$ organic group,
x is 0 or 1, and
$R^d$ is a substituted or unsubstituted $C_{1-20}$ alkyl, $C_{3-20}$ cycloalkyl, $C_{6-20}$ aryl, or $C_{7-20}$ aralkyl.

The invention is further illustrated by the following examples. All compounds and reagents used below are available commercially except where a procedure is provided. Triphenylsulfonium 1,1-difluoro-2-(methacryloyloxy)ethane-1-sulfonate (the TPS F2 PAG monomer) was obtained commercially from Central Glass.

EXAMPLES

Materials

Zirconium isopropoxide and hafnium isopropoxide were purchased from Strem Chemicals. Milli-Q water (18.2 MΩ·cm at 25° C.) was used in all experiments. Methyl methacrylate (MMA) was obtained from Aldrich and was filtered through basic alumina (Aldrich) to remove the inhibitor. 2,2'-Azobisisobutyronitrile (AIBN; Aldrich) was recrystallized from methanol. 2-Cyanopropan-2-yl dithiobenzoate (CPDB), isobutyric acid (IBA), triphenylsulfonium triflate (TPST) and ethyl lactate were purchased from Aldrich and used as received. Triphenylsulfonium 1,1-difluoro-2-(methacryloyloxy)ethane-1-sulfonate (the TPS F2 PAG monomer) was supplied by Dow Chemicals and used as received. All other solvents and chemicals were reagent grade.

Characterization Instruments $^1$H Nuclear Magnetic Resonance (NMR) Spectroscopy All NMR spectra were recorded on a Bruker AV3400 spectrometer operating at 400 MHz and 298 K using an external lock ($CDCl_3$) and utilizing a standard internal reference (solvent reference). Spectra were collected with 256 scans. Samples were prepared in deuterated acetone or chloroform.

Solid State Nuclear Magnetic Resonance (SS-NMR)

SS-NMR is non-destructive and requires very small amounts of material for analysis (50 mg or less). All SS-NMR samples were performed on 7.41 Tesla (300 MHz frequency) wide bore superconducting magnet interfaced with a two-channel Bruker Avance III spectrometer.

Thermogravimetric Analysis (TGA)

TGA was performed on a Mettler Toledo instrument STARe Thermogravimetric analyzer under $N_2$ atmosphere. The samples were heated from room temperature to 550° C. with a heating rate of 10° C./min.

Dynamic Light Scattering (DLS)

Hydrodynamic diameter measurements (the particle size and distribution of the nanoparticles) were determined using a Zetasizer (Malvern Instrument) at a fixed scattering angle of 173°. Experiments were performed at 25° C. Dilute solutions of nanoparticles in ethyl lactate were analyzed.

Transmission Electron Microscopy (TEM)

TEM images were taken by JEOL 1010 Transmission Electron Microscope equipped with Olympus soft imaging solutions veleta 2 k×2 k wide angle digital camera.

Attenuated Total Reflectance Fourier Transform Infrared (ATR-FTIR) Spectroscopy

ATR-FTIR spectra were obtained on a Nicolet Nexus 5700 FTIR spectrometer equipped with a Nicolet Smart Orbit single bounce, diamond ATR accessory (Thermo Electron Corp., Waltham, Mass.). Spectra were recorded at 8 $cm^{-1}$ resolution for 256 scans.

Atomic Force Microscopy (AFM)

AFM in air was performed using a stand-alone MFP-3D instrument in tapping mode. The AFM was mounted on an anti-vibration table (Herzan LLC) and operated within an acoustic isolation enclosure (TMC).

Procedures

Synthesis of $ZrO_2$-IBA Nanoparticles ($ZrO_2$-Isobutyrate Ligand Capped Nanoparticles)

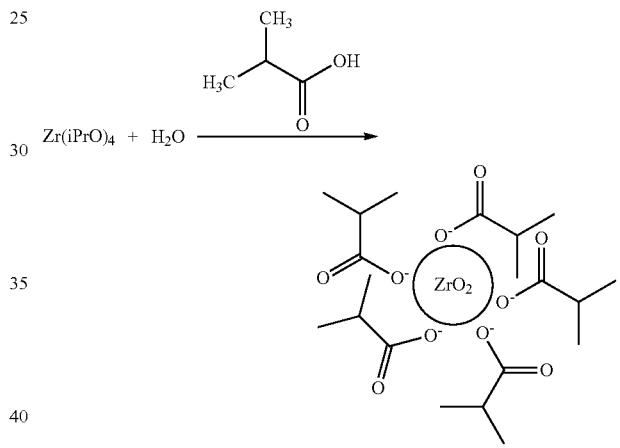

Zirconium isopropoxide (0.6 g) and isobutyric acid (6 mL) were mixed together in a vial and stirred at 65° C. for 15 minutes. Then 2 mL of $IBA/H_2O$ solution (94/6 v/v %) was added slowly via a syringe pump into the vial and stirred at 65° C. for 18 hours. Another 2 mL of the same $IBA/H_2O$ solution was also added slowly into the vial and stirred for another 3 hours. The final solution was a relatively yellowish clear solution (no color change since the beginning). This solution was purified three times by precipitation method in $H_2O$ and re-dissolved in acetone. The purified $ZrO_2$-IBA product was collected using high speed centrifuge and dried in a vacuum oven overnight. The product was then characterized by SS-NMR, DLS, TEM, ATR-FTIR, and TGA.

Synthesis of $HfO_2$-IBA Nanoparticles ($HfO_2$-Isobutyrate Ligand Capped Nanoparticles)

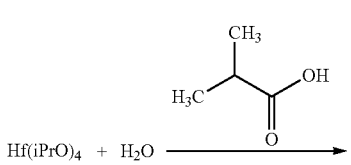

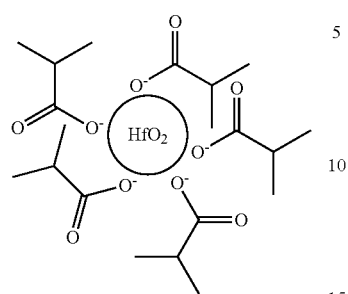

Hafnium isopropoxide (0.75 g) and isobutyric acid (6 mL) were mixed together in a vial and stirred at 65° C. for 15 minutes. Then 2 mL of IBA/H$_2$O solution (94/6 v/v %) was added slowly via a syringe pump into the vial and stirred at 65° C. for 18 hours. Another 2 mL of the same IBA/H$_2$O solution was also added slowly into the vial and stirred for another 3 hours. The final solution was a yellowish clear solution. This solution was purified three times by precipitation method in H$_2$O and re-dissolved in acetone. The purified HfO$_2$-IBA product was collected using high speed centrifuge and dried in a vacuum oven overnight.

Typical Formulation of ZrO$_2$-IBA Nanoparticles Blending with TPST Resist Solution ZrO$_2$-IBA nanoparticles (20 mg) and TPST (3 mg) were dissolved in ethyl lactate (0.8 mL) to make up a concentration of 25 mg/mL ZrO$_2$-IBA and 15% TPST with respect to the weight of the nanoparticles. The resist solution was then filtered through a 0.22 μm PTFE filter.

Typical Formulation of HfO$_2$-IBA Nanoparticles Blending with TPST Resist Solution HfO$_2$-IBA nanoparticles (20 mg) and TPST (3 mg) were dissolved in ethyl lactate (0.8 mL) to make up a concentration of 25 mg/mL HfO$_2$-IBA and 15% TPST with respect to the weight of the nanoparticles. The resist solution was then filtered through a 0.22 μm PTFE filter.

Typical Synthesis of PMMA-Co-PPAG (without Acid End Functionality) for the 'Blending Approach'

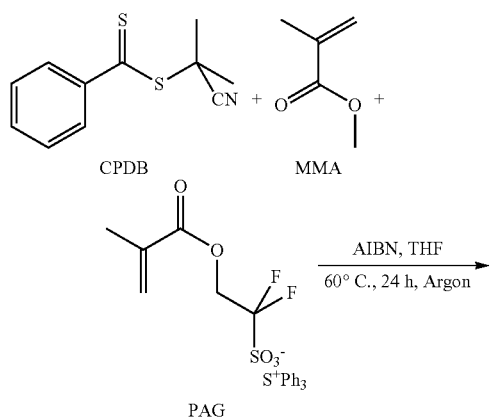

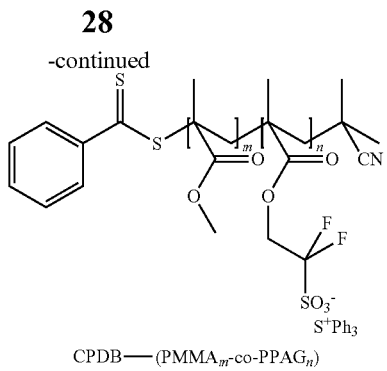

CPDB——(PMMA$_m$-co-PPAG$_n$)

A solution containing CPDB (0.20 g, 0.90 mmol), PAG (0.45 g, 0.90 mmol), MMA (2.71 g, 27.11 mmol), AIBN (30 mg, 0.18 mmol), and THF (19 mL) was placed in a round-bottom flask, sealed, and degassed with Argon for 15 minutes. The solution was then heated at 60° C. for 24 hours. The conversion of the polymer was determined by $^1$H-NMR. The polymer was purified by precipitation method using cold hexane/THF to remove the unreacted monomers of PAG and MMA. The purified polymer product was then dried overnight in a vacuum oven. For the characterization of the purified polymer: number-average MW ($M_n$) and degree of polymerization (DP) can be obtained from $^1$H-NMR, which were 3409 g/mol and PMMA$_{22}$-co-PPAG$_2$, respectively.

Typical Formulation of ZrO$_2$-IBA Nanoparticles Blending with PMMA-Co-PPAG Resist Solution ZrO$_2$-IBA (16.25 mg) and PMMA$_{22}$-co-PPAG$_2$ (1.69 mg) were dissolved in ethyl lactate (0.65 mL) to make up a concentration of 25 mg/mL ZrO$_2$-IBA and 10% PMMA$_{22}$-co-PPAG$_2$ (i.e., equivalent to 3% PPAG in the system) with respect to the weight of the ZrO$_2$-IBA. The resist solution was then filtered through a 0.22 μm PTFE filter.

Thin Film Preparation of ZrO$_2$-IBA Blending with TPST (or PMMA-Co-PPAG)

The resist solutions containing ZrO$_2$-IBA (25 mg/mL) and certain % of TPST (or PMMA-co-PPAG) were spin-coated into bare cleaned Si wafers (7.5 mm×7.5 mm). The spin-coating condition: 200 revolutions per minute (rpm) for 3 seconds (sec), followed by 2,000 rpm for 60 sec. The film thickness was measured by FilmTek.

Cleaning Procedure for the Si Wafers Used in this Project

The Si wafers were ultra-sonicated in HPLC grade acetone for 5 minutes, followed by ultrasonication in HPLC grade IPA for another 5 minutes. The Si wafers were then dried using nitrogen gas and put on a hot plate at 150° C. for 10 minutes.

Electron Beam Lithography of the Nanoparticle Resist

After spin-coating, the wafers were then patterned using EBL at a 10-20 kV acceleration voltage, with an aperture of 10 μm, step size of 20 nm and working distance of 7.7 mm. The pattern was designed using Raith's software and contained line/space patterns with critical dimension (CD) of 100 nm.

Development of the Nanoparticle Resist

Following the electron beam exposure, the film was developed by a solvent based developer under a certain time duration and dried with a stream of N$_2$ gas, forming negative tone resist. For example, for the ZrO$_2$-IBA (25 mg/mL) blending with 10% PMMA$_{22}$-co-PPAG$_2$ (i.e., 3% PPAG) system, the exposed film was developed under IPA/Acetone (97/3%) for 2 minutes.

Figure 2:
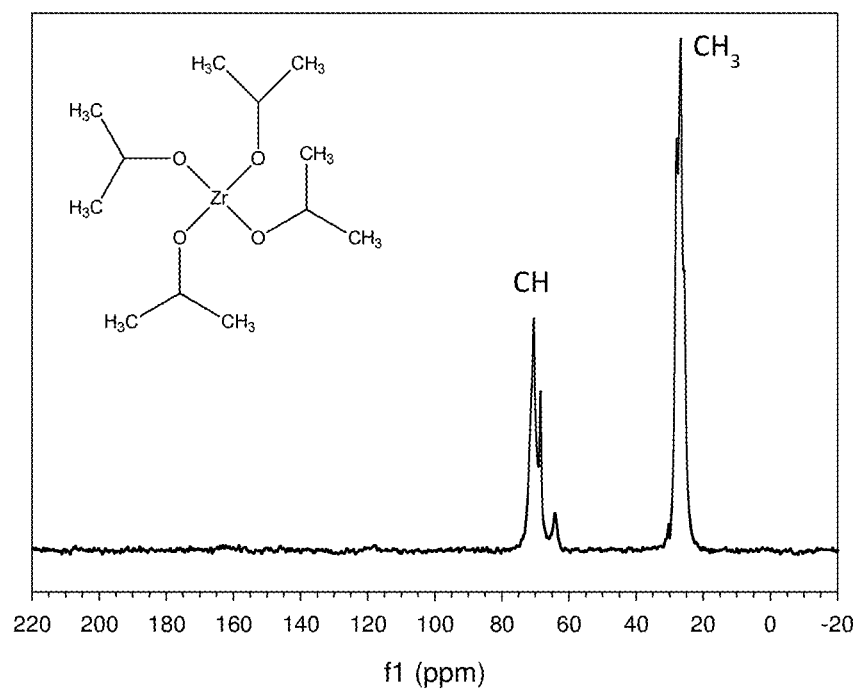
FIG. 2 is a graph representing a $^{13}$C-SS-NMR spectrum of zirconium isopropoxide.
Figure 3:
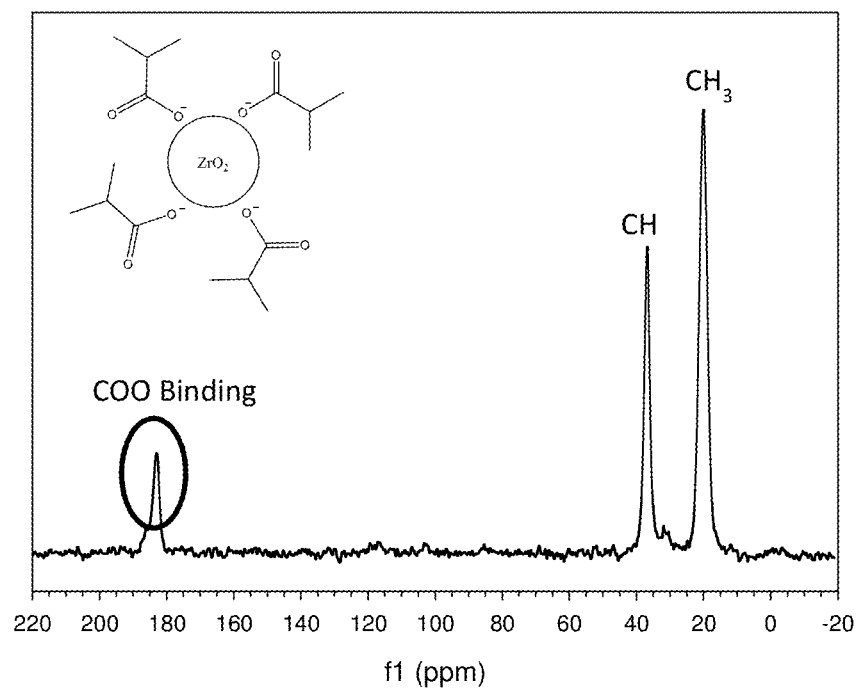
FIG. 3 is a graph representing a $^{13}$C-SS-NMR spectrum of $ZrO_2$-IBA.

Characterization of ZrO$_2$-IBA (and HfO$_2$-IBA) Nanoparticles $^{13}$C SS-NMR was used to check the conversion of the metal oxide precursor during the reaction. As FIG. 3 shows, the disappearance of both CH (~70 ppm) and CH$_3$ (~27 ppm) peaks of zirconium isopropoxide (FIG. 2) indicated that this metal precursor was fully reacted. Moreover, the peak appearance at 183 ppm indicated the successful carboxylate ligand binding to the nanoparticles.

Figure 4:
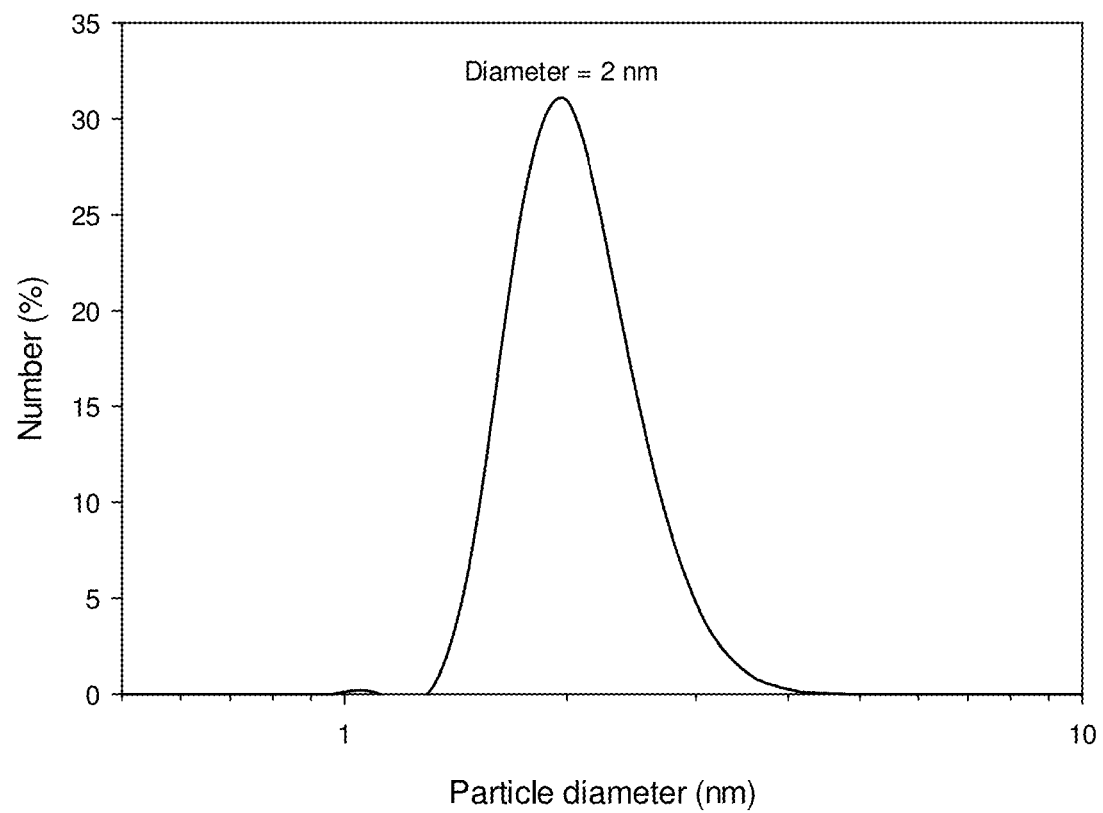
FIG. 4 is a graph representing a dynamic light scattering (DLS) diagram of $ZrO_2$-IBA in ethyl lactate.

Dynamic light scattering (DLS) (FIG. 4) was used to measure the hydrodynamic size of the nanoparticles and polydispersity factor (a dimensionless measure of the broadness of particle size distribution). The number mean diameter and polydispersity factor for ZrO$_2$-IBA were 2 nm and 0.3, respectively. Meanwhile for HfO$_2$-IBA they were 4 nm and 0.5, respectively.

Figure 5:
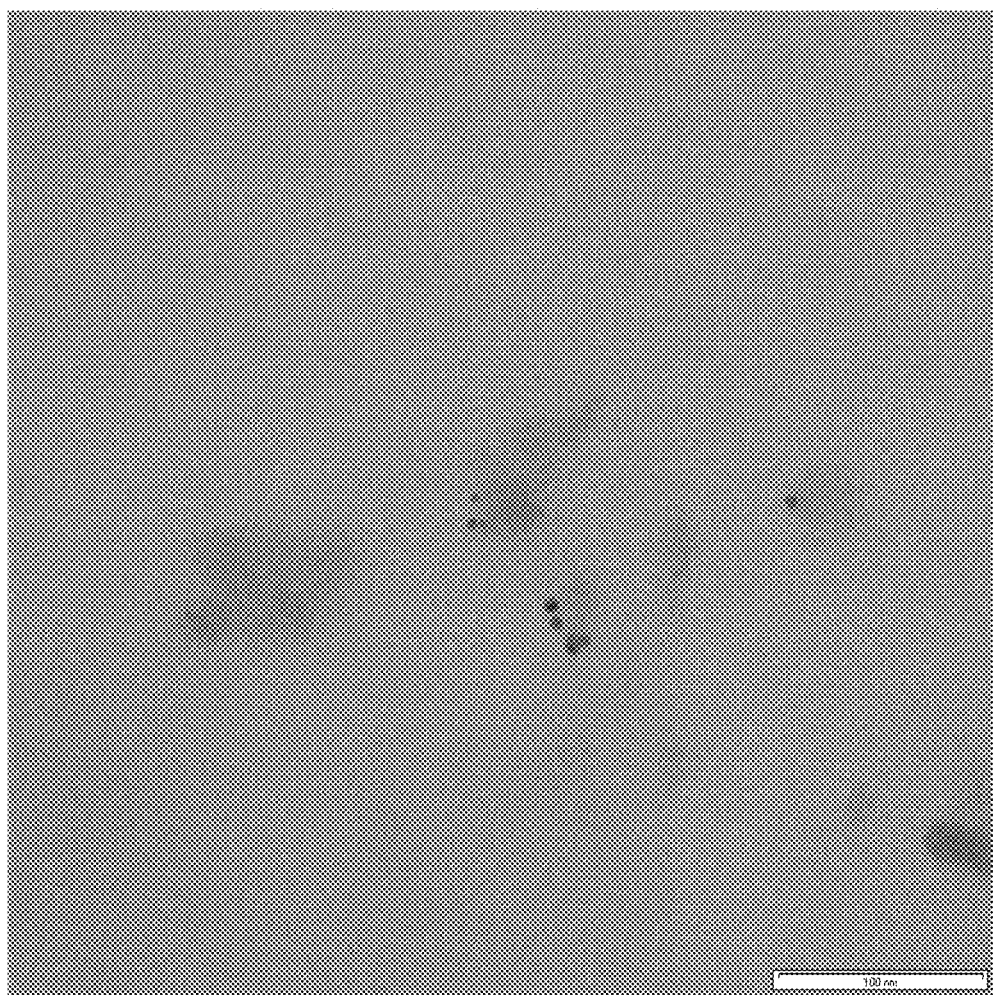
FIG. 5 is a transmission electron microscopy (TEM) image of $ZrO_2$-IBA at 300,000 magnification.

FIG. 5 shows that the ZrO$_2$-IBA nanoparticles had relatively spherical shape and 3 nm core diameter. This result is in agreement with the DLS result. Moreover, the TEM sample preparation requires evaporation of solvent (in this case ethyl lactate), which can cause the nanoparticles structure to collapse and form larger aggregates as can be seen in FIG. 5.

Figure 6:
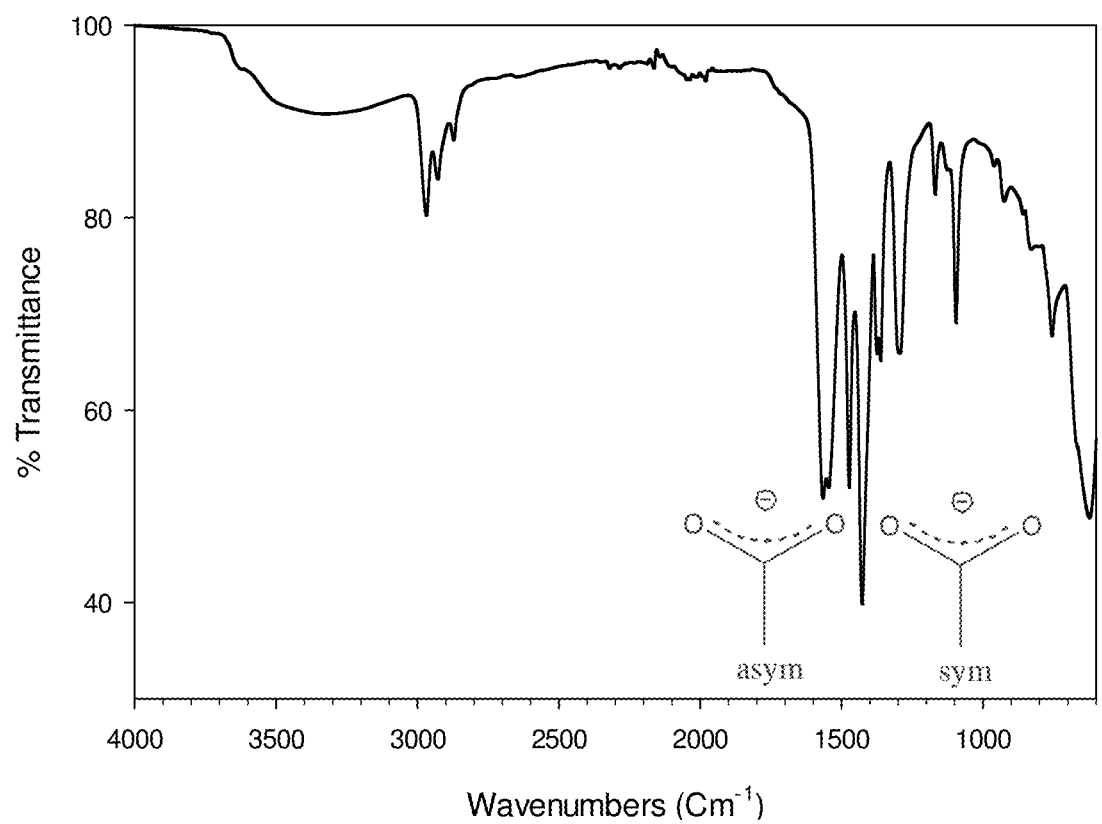
FIG. 6 is a graph representing an ATR-FTIR spectrum of $ZrO_2$-IBA.
Figure 7:
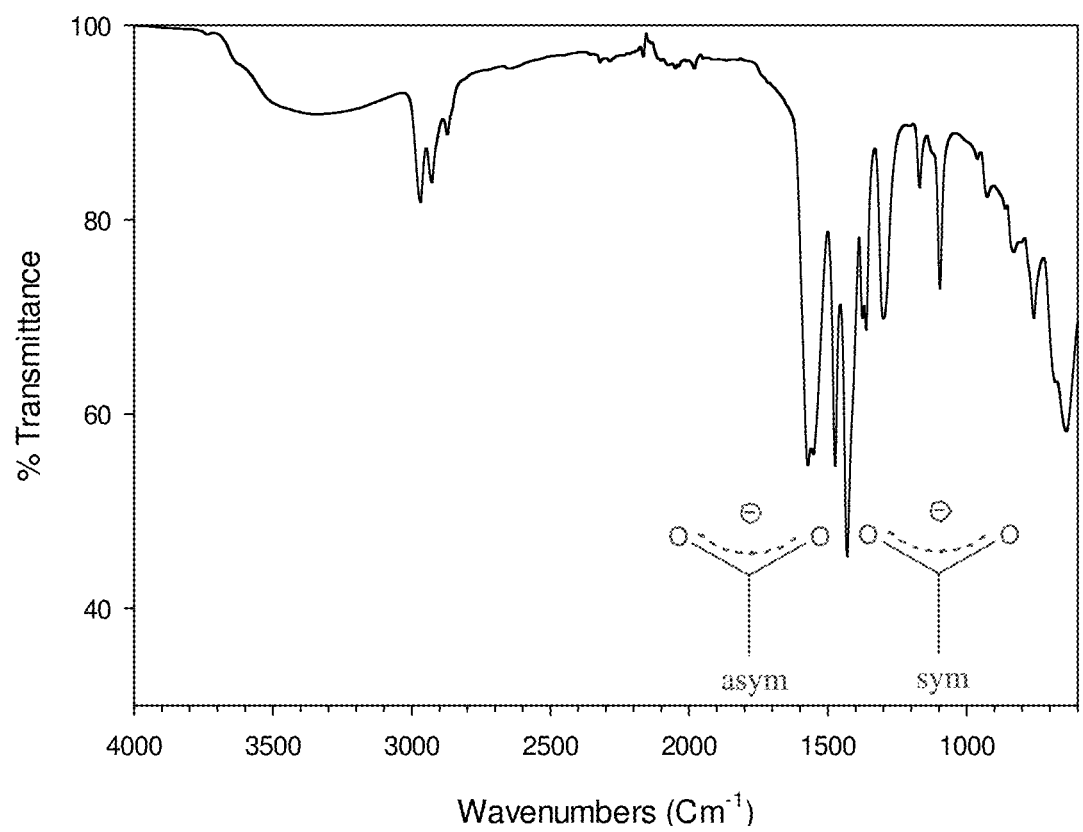
FIG. 7 is a graph representing an ATR-FTIR spectrum of $HfO_2$-IBA.

ATR-FTIR was used to detect isobutyrate ligand binding to the nanoparticles (ZrO$_2$ and HfO$_2$). FIGS. 6 and 7 show strong characteristic peaks of carboxylate anion, which are an asymmetrical stretching band near 1550 cm$^{-1}$ and a symmetrical stretching band near 1400 cm$^{-1}$, indicating successful carboxylate ligand binding on the nanoparticles. Moreover, the disappearance of the C=O peak near 1700 cm$^{-1}$ indicated the successful removal of excess isobutyric acid.

Figure 8:
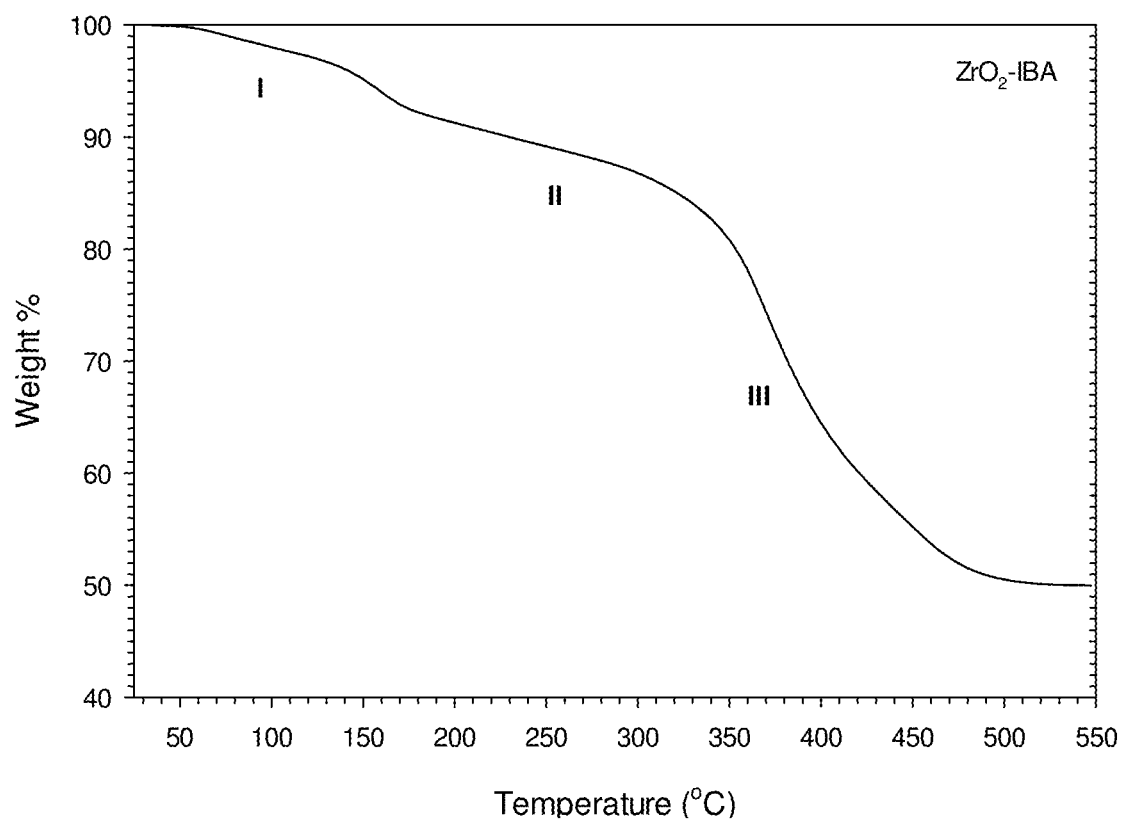
FIG. 8 is a graph representing a thermogravimetric analysis (TGA) of $ZrO_2$-IBA powder.
Figure 9:
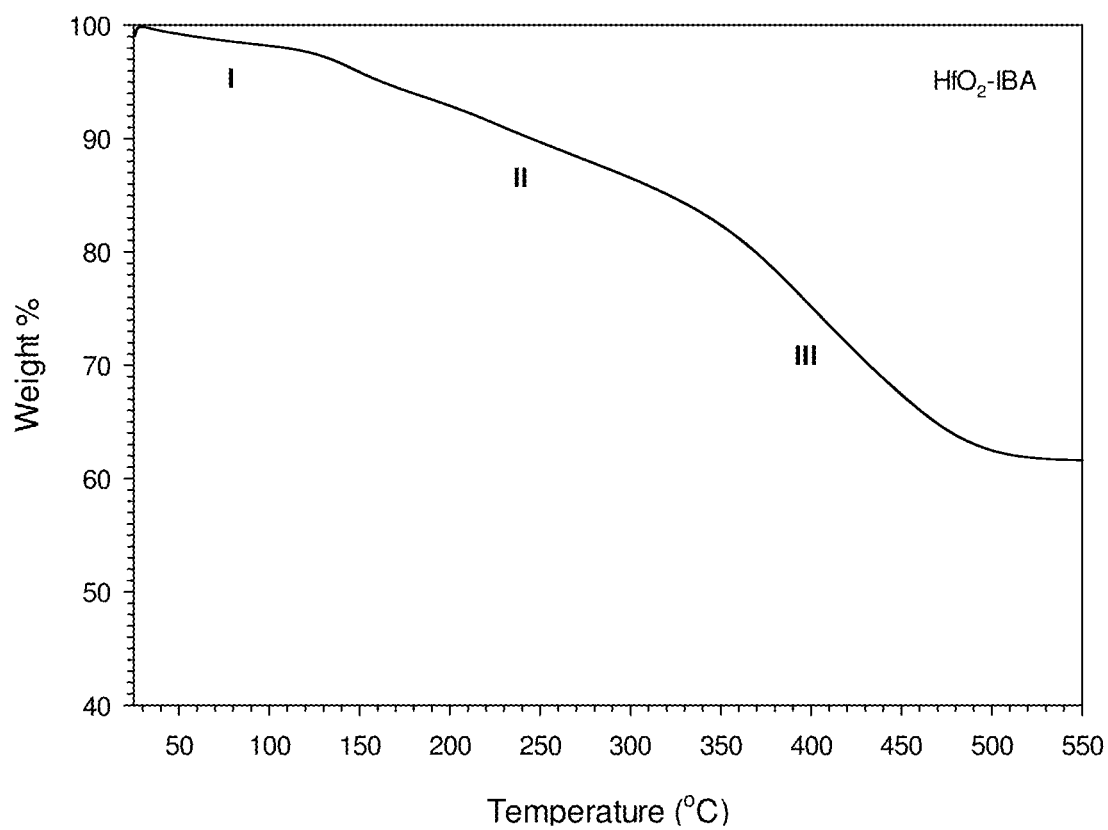
FIG. 9 is a graph representing a thermogravimetric analysis (TGA) of $HfO_2$-IBA powder.

TGA was used to examine the composition of the nanoparticle powders from the weight loss % as a function of temperature. Three weight loss steps can be observed for both ZrO$_2$-IBA (FIG. 8) and HfO$_2$-IBA (FIG. 9). The first step was most likely due to the water residue (~6% for ZrO$_2$-IBA and 3% for HfO$_2$-IBA). The second step may be due to some loosely bound organic ligand (~9% for ZrO$_2$-IBA and 14% for HfO$_2$-IBA). And the third step was likely due to the isobutyrate ligand (~34% for ZrO$_2$-IBA and 21% for HfO$_2$-IBA). The remaining component % after the heating process belonged to the inorganic core of the nanoparticles: ZrO$_2$ (~50%) and HfO$_2$ (~62%).

Figure 10:
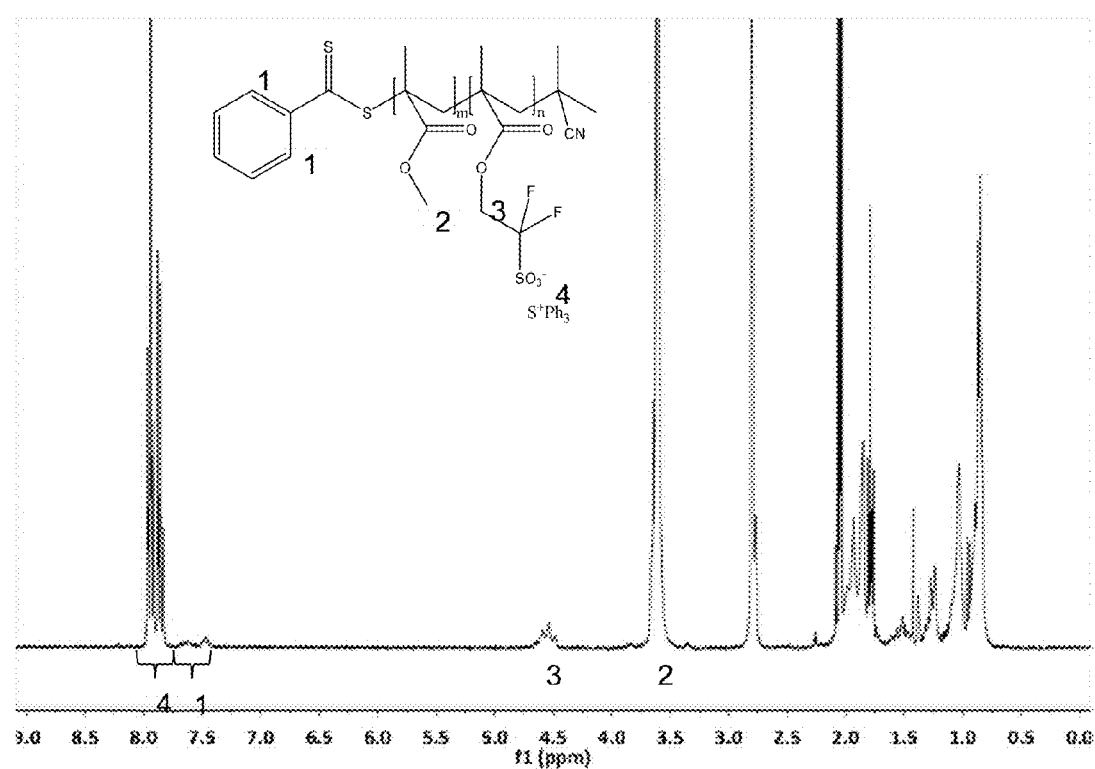
FIG. 10 is a graph representing a $^1$H-NMR spectrum of $PMMA_{22}$-co-$PPAG_2$.

Characterization of PMMA-Co-PPAG:

$^1$H-NMR was used to determine the degree of polymerization (DP) of the copolymers and thus the number-average MW (M$_n$), and to confirm the complete removal of unreacted monomers. FIG. 10 shows the typical $^1$H-NMR of PMMA-co-PPAG.

The nanoparticle-polymer resist solution was prepared by blending the metal oxide powder (ZrO$_2$-IBA or HfO$_2$-IBA) with PMMA-co-PPAG in resist solvent (in this case ethyl lactate). For the ZrO$_2$—IBA (25 mg/mL) and 3% PPAG system, the film thickness was measured after the spin-coating process to be ~50±0.3 nm. The resist film was patterned using EBL with area dose ranging from 140-520 µC/cm$^2$ and various ratios of critical dimension (CD) to line width (LW). After development in 97% IPA/3% Acetone for 2 minutes, the pattern height was measured by AFM.

Figure 11A:
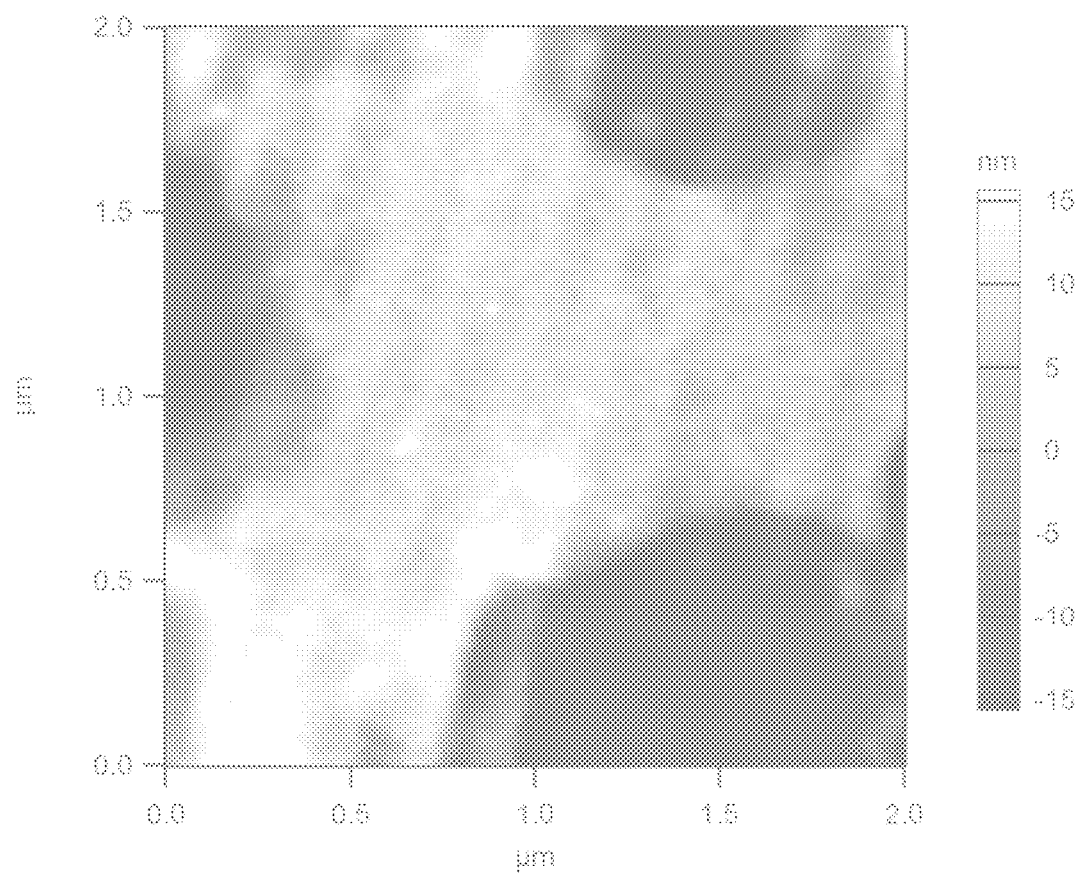
FIGS. 11A-11B are atomic force microscopy (AFM) images of CD target 100 nm (CD:LW=1:1) obtained at the area doses of 140 µC/cm² and 240 µC/cm², respectively.
Figure 11B:
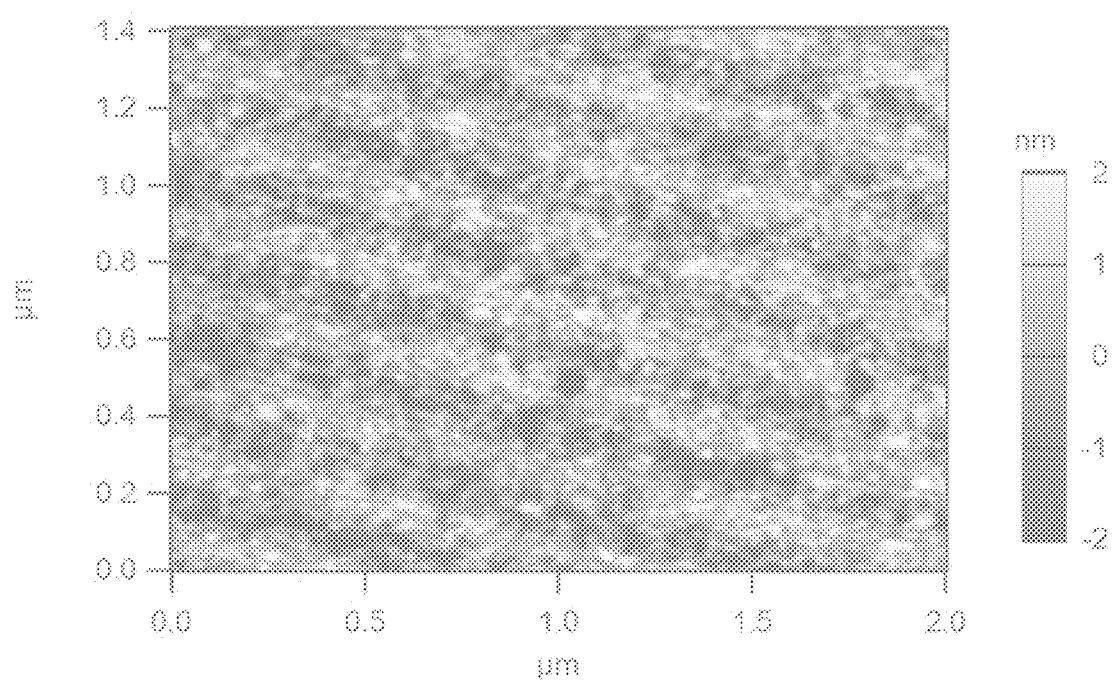
Figure 12A:
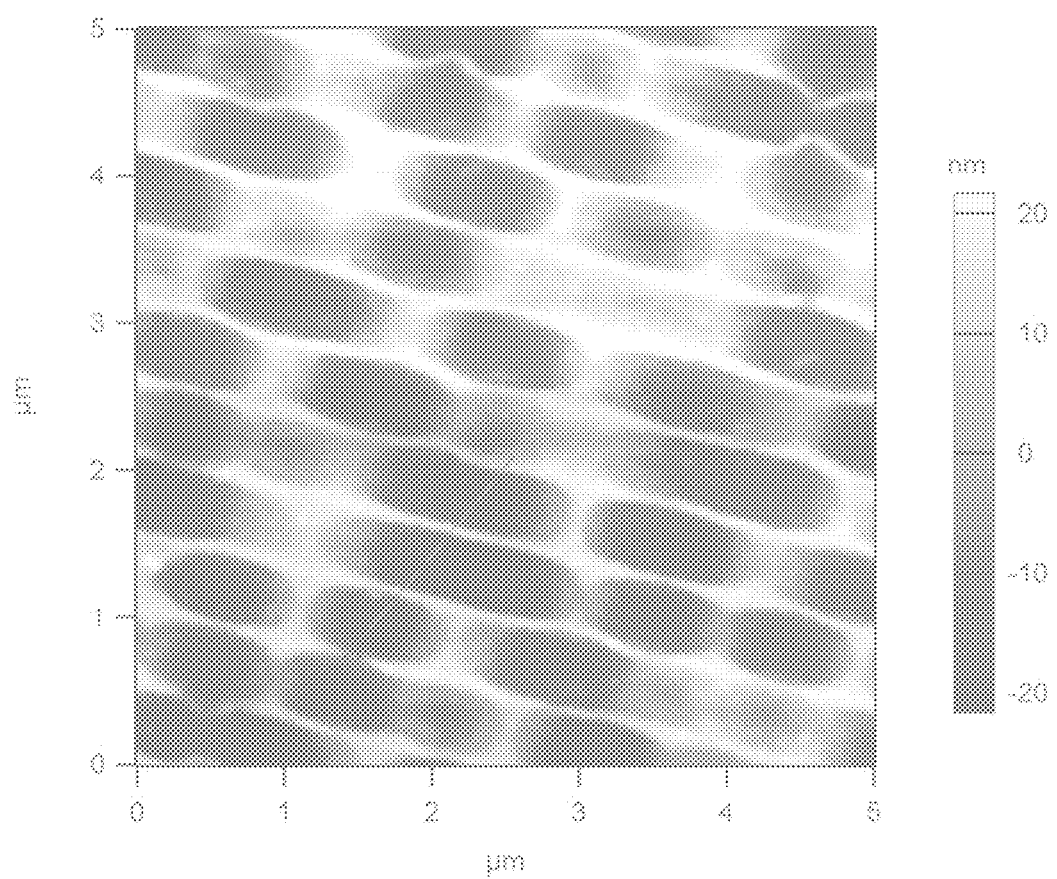
FIGS. 12A-12C are atomic force microscopy (AFM) images of CD target 100 nm (CD:LW=1:4) obtained at the area doses of 240 µC/cm², 340 µC/cm², and 460 µC/cm², respectively.
Figure 12B:
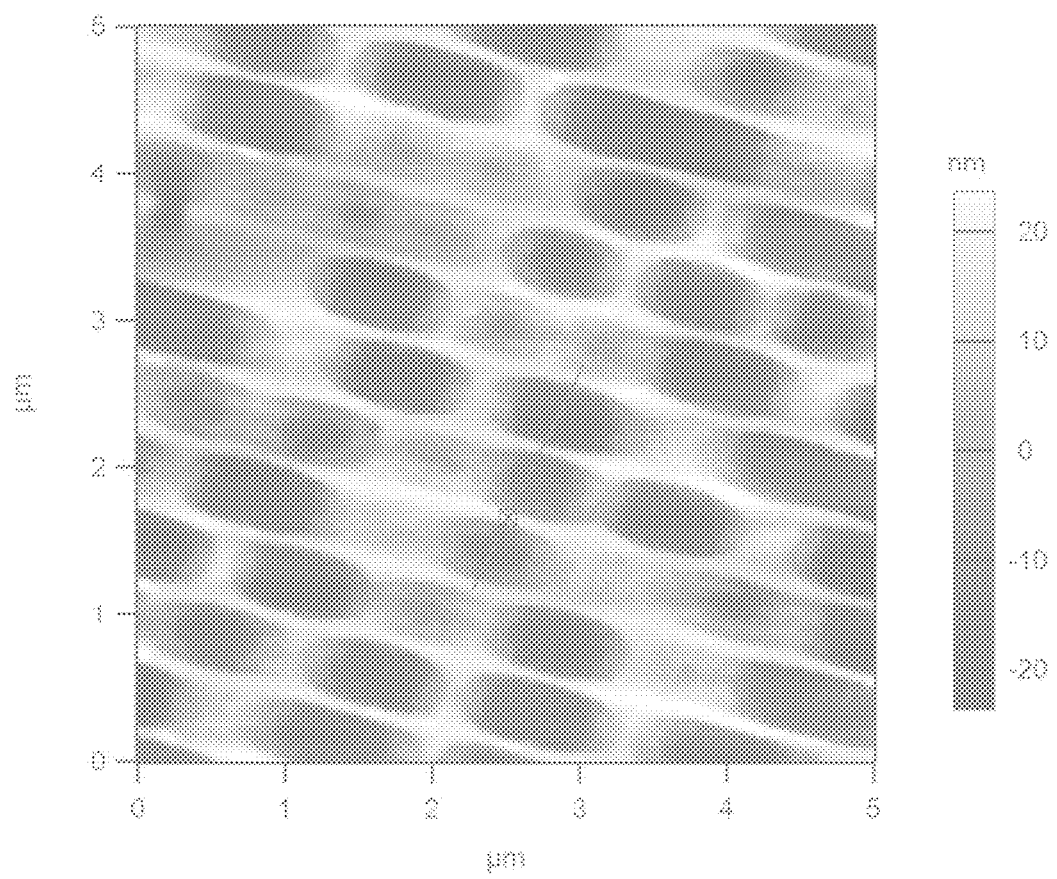
Figure 12C:
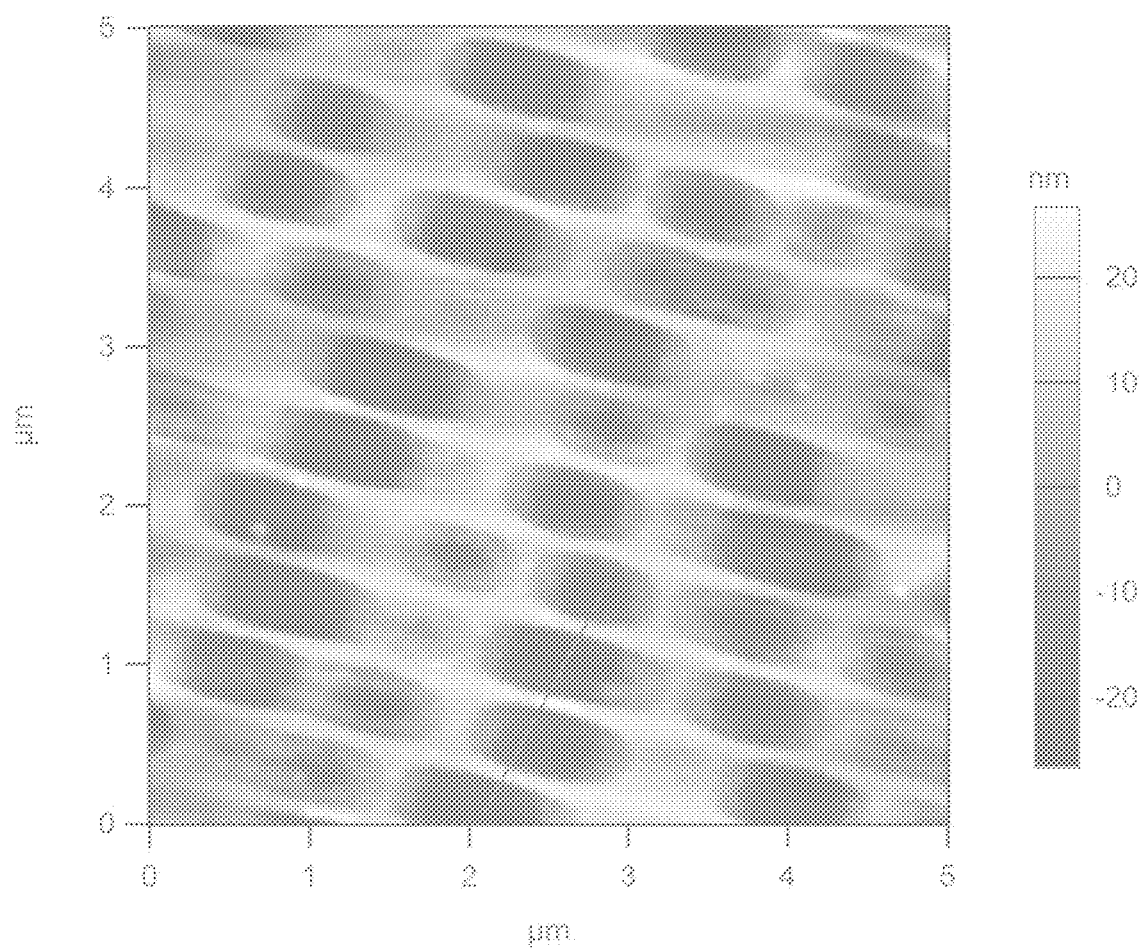

The atomic force microscopy (AFM) images indicate that the nanoparticle-polymer resist system can be successfully patterned and is very promising but still needs further optimization, especially in the pattern development area. FIG. 11 shows that patterns can be seen at 140 µC/cm$^2$ or even lower doses, and overexpose at 240 µC/cm$^2$. FIG. 12 shows that although the line widths have not been fully cleared, better pattern image with an increase in height was seen with increasing area dose.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A composite, which is a blend comprising:
a nanoparticle comprising a core and a coating surrounding the core; and
a polymer,
wherein the coating of the nanoparticle comprises a ligand, wherein the ligand is a substituted or unsubstituted C$_1$-C$_{16}$ carboxylic acid or a salt thereof, a substituted or unsubstituted C$_1$-C$_{16}$ amino acid or a salt thereof, a substituted or unsubstituted C$_1$-C$_{16}$ dialkyl phosphonate, or a combination thereof; and
wherein the polymer is a polymerization product of a group of reactants consisting of
a photoacid generator comprising a polymerizable group, a monomer of formula (IV-A):

(IV-A)

wherein,
R$^a$ is independently H, F, C$_{1-10}$ alkyl, or C$_{1-10}$ fluoroalkyl; and
R$^b$ is independently H, C$_{1-20}$ alkyl, C$_{3-20}$ cycloalkyl, C$_{6-20}$ aryl, or C$_{7-20}$ aralkyl, wherein each R$^b$ is separate or at least one R$^b$ is bonded to an adjacent R$^b$ to form a cyclic structure, and optionally,
a monomer selected from the group consisting of a base-soluble monomer of formula (V) or a lactone-containing monomer of formula (VI), but not both:

wherein,
W is a base-reactive group comprising —C(=O)—OH; —C(CF$_3$)$_2$OH; —NH—SO$_2$—Y$^1$ where Y$^1$ is F or C$_{1-4}$ perfluoroalkyl; an aromatic —OH; or an adduct of any of the foregoing with a vinyl ether, a is an integer of 1 to 3, and L is a monocyclic, polycyclic, or fused polycyclic $C_{4-20}$ lactone-containing group; and a chain transfer agent of formula (I);

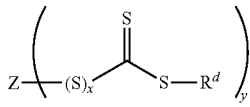
(I)

wherein:

Z is a y valent $C_{1-20}$ organic group, x is 0 or 1, and $R^d$ is a substituted or unsubstituted $C_{1-20}$ alkyl, $C_{3-20}$ cycloalkyl, $C_{6-20}$ aryl, or $C_{7-20}$ aralkyl.

2. The composite of claim 1, wherein the core of the nanoparticle comprises $ZrO_2$, $HfO_2$, $TiO_2$, or a combination thereof.

3. The composite of claim 1, wherein the ligand is a substituted or unsubstituted $C_1$-$C_{16}$ carboxylic acid or a salt thereof.

4. The composite of claim 1, wherein a median diameter of the nanoparticle is 10 nanometers or less.

5. The composite of claim 1, wherein photoacid generator comprising a polymerizable group is a monomer represented by formula (II):

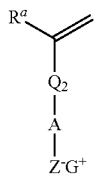
(II)

wherein each $R^a$ is independently H, F, $C_{1-10}$ alkyl, or $C_{1-10}$ fluoroalkyl;

$Q_2$ is a single bond or an ester-containing or non-ester containing, fluorinated or non-fluorinated group selected from $C_{1-20}$ alkylene, $C_{3-20}$ cycloalkylene, $C_{6-20}$ arylene, and $C_{7-20}$ aralkylene group;

A is an ester-containing or non ester-containing, fluorinated or non-fluorinated group selected from $C_{1-20}$ alkylene, $C_{3-20}$ cycloalkylene, $C_{6-20}$ arylene, and $C_{7-20}$ aralkylene;

Z is an anionic moiety comprising sulfonate, an anion of a sulfonamide, or an anion of a sulfonimide; and $G^+$ has formula (III):

(III)

wherein X is S or I, each $R^c$ is halogenated or non-halogenated and is independently a $C_{1-30}$ alkyl group; a polycyclic or monocyclic $C_{3-30}$ cycloalkyl group; a polycyclic or monocyclic $C_{4-30}$ aryl group, wherein when X is S, one of the $R^c$ groups is optionally attached to one adjacent $R^c$ group by a single bond, and z is 2 or 3, wherein when X is I, z is 2, or when X is S, z is 3.

6. The composite of claim 5, wherein $G^+$ has formula (VII), (VIII), or (IX):

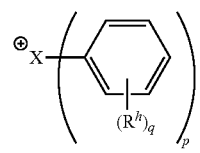
(VII)

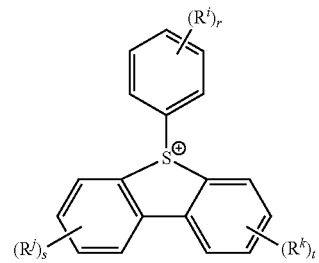
(VIII)

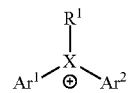
(IX)

wherein

X is I or S, $R^h$, $R^i$, $R^j$, and $R^k$ are each independently hydroxy, nitrile, halogen, $C_{1-10}$ alkyl, $C_{1-10}$ fluoroalkyl, $C_{1-10}$ alkoxy, $C_{1-10}$ fluoroalkoxy, $C_{6-20}$ aryl, $C_{6-20}$ fluoroaryl, $C_{6-20}$ aryloxy, or $C_{6-20}$ fluoroaryloxy, $Ar^1$ and $Ar^2$ are independently $C_{10-30}$ fused or singly bonded polycyclic aryl groups;

$R^l$ is a lone pair of electrons where X is I, or a $C_{6-20}$ aryl group where X is S; p is an integer of 2 or 3, wherein when X is I, p is 2, and where X is S, p is 3, q and r are each independently an integer from 0 to 5, and s and t are each independently an integer from 0 to 4.

7. The composite of claim 1, wherein the organic group Z is bonded to the polymer to form an end group having the structure shown below:

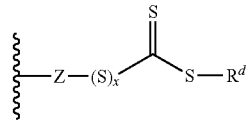

wherein Z is a v valent $C_{1-20}$ organic group, x is 0 or 1, and $R^d$ is a substituted or unsubstituted $C_{1-20}$ alkyl, $C_{3-20}$ cycloalkyl, $C_{6-20}$ aryl, or $C_{7-20}$ aralkyl.

8. The composite of claim 1, wherein the chain transfer agent of formula (I) has the structure of formula (X):

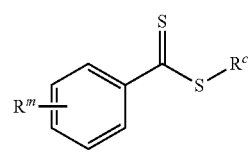
(X)

wherein $R^m$ is a $C_{1-10}$ alkyl, $C_{1-10}$ alkoxy, $C_{3-10}$ cycloalkyl, $C_{6-10}$ aryl, or $C_{7-10}$ aralkyl group, and $R^c$ is substituted or unsubstituted and is a $C_{1-10}$ alkyl or $C_{6-10}$ aryl group.

9. A photoresist composition comprising the composite of claim 1.

10. A coated substrate, comprising: (a) a substrate having one or more layers to be patterned on a surface thereof; and (b) a layer of a photoresist composition of claim 9 over the one or more layers to be patterned.

11. A method of forming an electronic device comprising:
(a) applying a layer of the photoresist composition of claim 9 on a surface of the substrate;
(b) pattern-wise exposing the photoresist composition layer to activating radiation; and
(c) developing the exposed photoresist composition layer with a solvent to provide a resist relief image.

12. The composite of claim 11, wherein the resist relief image is a negative image.

13. The method of claim 11, wherein the solvent is a mixture of an alcohol and a ketone.

14. A method of making a composite, comprising contacting a nanoparticle comprising a core and a coating surrounding the core; and a polymer, wherein the coating of the nanoparticle comprises a ligand, wherein the ligand is a substituted or unsubstituted $C_1$-$C_{16}$ carboxylic acid or a salt thereof, a substituted or unsubstituted $C_1$-$C_{16}$ amino acid or a salt thereof, a substituted or unsubstituted $C_1$-$C_{16}$ dialkyl phosphonate, or a combination thereof; and wherein the polymer is a polymerization product of a group of reactants consisting of a photoacid generator comprising a polymerizable group, a monomer of formula (IV-A):

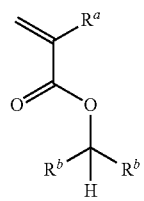

(IV-A)

wherein, $R^a$ is independently H, F, $C_{1-10}$ alkyl, or $C_{1-10}$ fluoroalkyl; and $R^b$ is independently H, $C_{1-20}$ alkyl, $C_{3-20}$ cycloalkyl, $C_{6-20}$ aryl, or $C_{7-20}$ aralkyl, wherein each $R^b$ is separate or at least one $R^b$ is bonded to an adjacent $R^b$ to form a cyclic structure, and optionally a monomer selected from the group consisting of a base-soluble monomer of formula (V) or a lactone-containing monomer of formula (VI), but not both:

(V)

(VI)

wherein,

W is a base-reactive group comprising —C(=O)—OH; —C(CF$_3$)$_2$OH; —NH—SO$_2$—Y$^1$ where Y$^1$ is F or $C_{1-4}$ perfluoroalkyl; an aromatic —OH; or an adduct of any of the foregoing with a vinyl ether, a is an integer of 1 to 3, L is a monocyclic, polycyclic, or fused polycyclic $C_{4-20}$ lactone-containing group; and a chain transfer agent of formula (I);

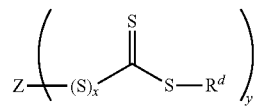

(I)

wherein:

Z is a y valent $C_{1-20}$ organic group, x is 0 or 1, and $R^d$ is a substituted or unsubstituted $C_{1-20}$ alkyl, $C_{3-20}$ cycloalkyl, $C_{6-20}$ aryl, or $C_{7-20}$ aralkyl.

* * * * *